(12) United States Patent
Otsuji

(10) Patent No.: US 10,900,127 B2
(45) Date of Patent: Jan. 26, 2021

(54) SUBSTRATE PROCESSING METHOD AND SUBSTRATE PROCESSING APPARATUS

(71) Applicant: SCREEN Holdings Co., Ltd., Kyoto (JP)

(72) Inventor: Masayuki Otsuji, Kyoto (JP)

(73) Assignee: SCREEN Holdings Co., Ltd.

( * ) Notice: Subject to any disclaimer, the term of this patent is extended or adjusted under 35 U.S.C. 154(b) by 204 days.

(21) Appl. No.: 15/841,999

(22) Filed: Dec. 14, 2017

(65) Prior Publication Data

US 2018/0195178 A1    Jul. 12, 2018

(30) Foreign Application Priority Data

Jan. 12, 2017    (JP) .................................. 2017-003275

(51) Int. Cl.
| | |
|---|---|
| *B05D 3/12* | (2006.01) |
| *C23F 1/02* | (2006.01) |
| *H01L 21/02* | (2006.01) |
| *H01L 21/67* | (2006.01) |

(Continued)

(52) U.S. Cl.
CPC .......... *C23F 1/02* (2013.01); *H01L 21/02019* (2013.01); *H01L 21/02057* (2013.01); *H01L 21/6708* (2013.01); *H01L 21/67028* (2013.01); *H01L 21/67109* (2013.01); *H01L 21/67248* (2013.01); *H01L 21/68792* (2013.01); *B05D 1/005* (2013.01)

(58) Field of Classification Search
CPC ......... H01L 21/02019; H01L 21/02057; H01L 21/67028; H01L 21/6708; H01L 21/67109; H01L 21/67248; H01L 21/68792; C23F 1/02; B05D 1/005
See application file for complete search history.

(56) References Cited

U.S. PATENT DOCUMENTS

| | | | |
|---|---|---|---|
| 2003/0000034 A1 | 1/2003 | Welsh et al. ...................... 15/77 |
| 2008/0060686 A1 | 3/2008 | Miya et al. ...................... 134/37 |
| 2009/0101181 A1 | 4/2009 | Morisawa et al. ............ 134/94.1 |

(Continued)

FOREIGN PATENT DOCUMENTS

| | | |
|---|---|---|
| JP | H09-293702 A | 11/1997 |
| JP | 2005-515613 A | 5/2005 |

(Continued)

*Primary Examiner* — Kirsten Jolley
(74) *Attorney, Agent, or Firm* — Ostrolenk Faber LLP

(57) ABSTRACT

In a substrate processing method, a liquid film 30 of a processing liquid is formed on an upper surface of a substrate W, a gas which comprising vapor of a low surface tension liquid is sprayed to the liquid film 30 to form a liquid film-removed region 31. The liquid film-removed region 31 is expanded. A coolant 29 is supplied to a lower surface of the substrate W, while the liquid film 30 is cooled to a temperature lower than the boiling point of the low surface tension liquid, a heated gas is sprayed to selectively remove the coolant 29, and a range 33 in which the coolant 29 is removed is heated by a heated gas, by which the liquid film-removed region 31 on the upper surface of the substrate W is selectively heated to a temperature not less than the boiling point of the low surface tension liquid, and also a range which heats the liquid film-removed region 31 is expanded in synchronization with expansion of the liquid film-removed region 31.

5 Claims, 13 Drawing Sheets

(51) Int. Cl.
*H01L 21/687* (2006.01)
*B05D 1/00* (2006.01)

(56) References Cited

U.S. PATENT DOCUMENTS

| | | | | |
|---|---|---|---|---|
| 2010/0146813 | A1* | 6/2010 | Jeong | H01L 21/02057 |
| | | | | 34/519 |
| 2010/0325913 | A1 | 12/2010 | Wang et al. | 34/423 |
| 2012/0103371 | A1* | 5/2012 | Yun | H01L 21/67034 |
| | | | | 134/26 |
| 2012/0260517 | A1* | 10/2012 | Lenz | F26B 3/04 |
| | | | | 34/357 |
| 2015/0020852 | A1 | 1/2015 | Kato et al. | 134/30 |
| 2015/0243542 | A1 | 8/2015 | Yoshihara et al. | |

FOREIGN PATENT DOCUMENTS

| | | |
|---|---|---|
| JP | 2008-071875 A | 3/2008 |
| JP | 2008-130951 A | 6/2008 |
| JP | 2011-009599 A | 1/2011 |
| JP | 2013-131783 A | 7/2013 |
| KR | 10-2015-0009450 A | 1/2015 |
| KR | 10-2015-0101951 A | 9/2015 |

\* cited by examiner

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of the Related Art

In a manufacturing process for semiconductor devices, a processing liquid is supplied onto a front surface of a substrate of a semiconductor wafer etc., to process the front surface of the substrate by using the processing liquid.

For example, a single substrate processing type substrate processing apparatus which processes a substrate one by one is provided with a spin chuck for rotating a substrate while holding the substrate substantially horizontally and a nozzle for supplying a processing liquid to an upper surface of the substrate which is rotated by the spin chuck.

In a typical substrate processing step, a chemical liquid is supplied to a substrate which is held by a spin chuck and, thereafter, water is supplied, by which the chemical liquid on the substrate is replaced with water. Thereafter, a drying process is performed for removing the water from the upper surface side of the substrate.

As a drying process, there is known a technique for supplying vapor of an organic solvent (low surface tension liquid) such as isopropyl alcohol (IPA) lower in surface tension than water to a front surface of a substrate which is in a rotation state. For example, Rotagoni drying is one example of the method (refer to JP2013-131783A, for example).

SUMMARY OF THE INVENTION

As the above-described drying method, specifically, a liquid film of a processing liquid (water) is formed on an upper surface of a substrate, and a gas which contains a low surface tension liquid (such as vapor of low surface tension liquid) is sprayed on the liquid film, thereby forming a liquid film-removed region on the upper surface of the substrate, for example, at a central portion of the substrate.

Then, a boundary (hereinafter, referred to as "liquid film boundary") between the liquid film-removed region and an edge portion of the liquid film adjacent to the liquid film-removed region is moved to a circumferential edge of the substrate from the central portion of the substrate. Thereby, the liquid film-removed region is expanded to extend the liquid film-removed region to an entire area on the upper surface of the substrate. Thereby, it is possible to dry the upper surface of the substrate.

The present inventor concerned has found that where this type of drying technique is adopted, a liquid film boundary is moved in a state that a contact angle formed between a liquid surface of a processing liquid at the liquid film boundary and an upper surface of a substrate is kept large, thus making it possible to remove the processing liquid existing between patterns in an extremely short period of time. At the time of drying, since pattern collapse at the time of drying can be suppressed as the removal time of the processing liquid existing between patterns becomes shorter, the inventor focused attention on the above-described drying technique as a drying method capable of suppressing pattern collapse.

However, in recent years, due to high integration of a device manufactured by utilizing substrate processing (for example, a semiconductor device), a fine and high aspect-ratio pattern (such as a protrusion pattern and a line-shaped pattern) has been formed on a front surface of a substrate. A fine and high aspect-ratio pattern is low in strength and may cause collapse even when the drying technique described in JP2013-131783A is adopted.

Therefore, an object of the present invention is to provide a substrate processing method and a substrate processing apparatus which are capable of drying an upper surface of a substrate, while effectively suppressing pattern collapse.

One embodiment of the present invention provides a substrate processing method which includes a substrate holding step which holds a substrate horizontally, a liquid film forming step which supplies a processing liquid to an upper surface of the substrate to form a liquid film of the processing liquid which covers the upper surface of the substrate, a liquid film-removed region forming step which forms a liquid film-removed region in which the processing liquid is removed from a portion of the liquid film on the upper surface of the substrate, a liquid film-removed region expanding step which expands the liquid film-removed region which has been formed, a vapor supplying step which supplies a gas that contains vapor of a low surface tension liquid lower in surface tension than the processing liquid from the upper surface side of the substrate to an edge portion of the liquid film adjacent to the liquid film-removed region in parallel with the liquid film-removed region expanding step, a cooling/heating step which heats the liquid film-removed region to a temperature not less than the boiling point of the low surface tension liquid while cooling a portion excluding the edge portion of the liquid film on the substrate to a temperature lower than the boiling point of the low surface tension liquid from the lower surface side of the substrate, in parallel with the liquid film-removed region expanding step, and a heating range expanding step which expands a range that heats the liquid film-removed region from the lower surface side of the substrate in synchronization with expansion of the liquid film-removed region.

According to the above-described method, of the liquid film on the substrate, a periphery of the edge portion is made into a gas atmosphere which contains vapor of the low surface tension liquid, by which the low surface tension liquid contained in the gas is dissolved into the processing liquid at the edge portion of the liquid film. Therefore, a difference in concentration of the low surface tension liquid, that is, a difference in surface tension will develop between the edge portion of the liquid film and a portion excluding the edge portion (a bulk portion of the liquid film) of the liquid film.

Further, in a state that the bulk portion of the liquid film is cooled to a temperature lower than the boiling point of the low surface tension liquid, the liquid film-removed region on the upper surface of the substrate is heated to a temperature not less than the boiling point of the low surface tension liquid. Thereby, heat conduction via the substrate raises a temperature of the edge portion of the liquid film adjacent to the liquid film-removed region, thereby causing a difference in temperature between the edge portion of the liquid film and the bulk portion of the liquid film.

Therefore, due to contraction actions of the liquid film resulting from the Marangoni effect based on a difference in surface tension between the edge portion of the liquid film and the bulk portion of the liquid film and a difference in temperature thereof, the processing liquid shows behavior of rising upward at the edge portion of the liquid film, resulting in a large contact angle formed by the liquid surface of the processing liquid at the liquid film boundary and the upper surface of the substrate.

Further, the liquid film-removed region on the upper surface of the substrate is heated to a temperature not less than the boiling point of the low surface tension liquid from the lower surface side of the substrate. Thereby, of the edge portion of the liquid film, at a solid/liquid interface portion directly in contact with the upper surface of the substrate adjacent to the liquid film-removed region, the processing liquid into which the low surface tension liquid has been dissolved at a high concentration is accelerated for evaporation. Therefore, at the edge portion of the liquid film, the processing liquid shows behavior of rising upward, resulting in a large contact angle formed by the liquid surface of the processing liquid at the liquid film boundary and the upper surface of the substrate.

That is, in combination with contraction actions of the liquid film resulting from the Marangoni effect with evaporation actions at the solid/liquid interface portion, a contact angle formed between the liquid surface of the processing liquid at the liquid film boundary and the upper surface of the substrate is made large. Thus, it is possible to suppress pattern collapse more favorably than a case where the technique described in JP2013-131783A is adopted.

Further, the liquid film-removed region on the upper surface of the substrate is heated to a temperature not less than the boiling point of the low surface tension liquid, thereby suppressing condensation of the low surface tension liquid at the liquid film-removed region. Therefore, it is also possible to suppress pattern collapse due to the fact that a liquid film of the low surface tension liquid which is thicker than the height of a pattern is formed by condensation at the liquid film-removed region.

Therefore, according to the above-described method, it is possible to dry the upper surface of the substrate while effectively suppressing pattern collapse.

In one embodiment of the present invention, in parallel with the liquid film-removed region forming step, the liquid film-removed region expanding step, the vapor supplying step, the cooling/heating step and the heating range expanding step, the above-described method further includes a substrate rotating step in which the substrate is rotated around a predetermined vertical rotation axis. From the liquid film-removed region forming step to the liquid film-removed region expanding step, the substrate rotating step is executed to rotate the substrate, while spraying the gas in the vicinity of the rotation center of the upper surface of the substrate, thereby forming the liquid film-removed region in a substantially circular shape at a region on the upper surface of the substrate which includes the rotation center, and a position at which the gas is sprayed is moved from the rotation center outward in a radial direction to expand the liquid film-removed region. From the cooling/heating step to the heating range expanding step, the substrate rotating step is executed to rotate the substrate, while heating a range on the lower surface of the substrate which corresponds to the liquid film-removed region and includes the rotation center to a temperature not less than the boiling point of the low surface tension liquid, and the range to be heated is expanded from the rotation center outward in a radial direction in synchronization with expansion of the liquid film-removed region by movement of a position at which the gas is sprayed.

According to the above-described method, while the substrate is rotated, a position at which the gas that contains vapor of the low surface tension liquid is sprayed is moved from a region which includes the rotation center on the upper surface of the substrate outward in a radial direction, and in synchronization with expansion of the liquid film-removed region, a range at which the liquid film-removed region is heated to a temperature not less than the boiling point of the low surface tension liquid from the lower surface side of the substrate can be expanded from the rotation center outward in a radial direction.

Therefore, according to the above-described method, it is possible to dry the upper surface of the substrate more effectively, while suppressing pattern collapse more effectively.

In one embodiment of the present invention, the cooling/heating step includes a cooling step in which a coolant is supplied to the lower surface of the substrate substantially in its entirety, thereby cooling the liquid film to a temperature lower than the boiling point of the low surface tension liquid and a heating step in which a heated gas is sprayed at a position on the lower surface of the substrate which corresponds to the liquid film-removed region, thereby heating the liquid film-removed region to a temperature not less than the boiling point of the low surface tension liquid. The heating range expanding step includes a spray position moving step in which a position on the lower surface of the substrate at which the heated gas is sprayed is moved in synchronization with movement of a boundary between the liquid film and the liquid film-removed region by expansion of the liquid film-removed region.

According to the above-described method, while the liquid film on the upper surface of the substrate is cooled to a temperature lower than the boiling point of the low surface tension liquid by the coolant which has been supplied to the lower surface of the substrate, the coolant in a range corresponding to the liquid film-removed region on the upper surface of the substrate is selectively removed by spraying a heated gas which has been heated to a temperature not less than the boiling point of the low surface tension liquid, thus making it possible to effectively heat the liquid film-removed region on the upper surface of the substrate which corresponds to the range in which the coolant has been removed to a temperature not less than the boiling point of the low surface tension liquid.

In one embodiment of the present invention, from the liquid film-removed region forming step to the liquid film-removed region expanding step, the gas is made into a thin layer form over the entire width of the upper surface of the substrate and sprayed at one end portion of the upper surface of the substrate, by which the liquid film-removed region is formed in the vicinity of the one end portion of the upper surface of the substrate, and also a position at which the gas is sprayed is moved from the one end portion to the other end portion of the substrate to expand the liquid film-removed region. The cooling/heating step includes a cooling step in which a coolant is supplied to the lower surface of the substrate substantially in its entirety to cool the liquid film to a temperature lower than the boiling point of the low surface tension liquid, and a heating step in which a heated gas is made into a thin layer form over the entire width of the lower surface of the substrate parallel to the gas in the thin layer form and sprayed at a position on the lower surface of the substrate which corresponds to the liquid film-removed region, thereby heating the liquid film-removed region to a temperature not less than the boiling point of the low surface tension liquid. The heating range expanding step includes a spray position moving step in which a position on the lower surface of the substrate at which the heated gas is sprayed is moved in synchronization with movement of a boundary between the liquid film and the liquid film-removed region by expansion of the liquid film-removed region.

According to the above-described method, a gas which contains vapor of the low surface tension liquid is made into a thin layer form over the entire width of the upper surface of the substrate and sprayed, while the spray position is moved from one end portion of the upper surface of the substrate to the other end portion, by which the liquid film-removed region is formed in the vicinity of one end portion of the upper surface of the substrate and the liquid film-removed region can also be expanded to the other end portion of the upper surface of the substrate.

Further, while the liquid film on the upper surface of the substrate is cooled to a temperature lower than the boiling point of the low surface tension liquid by a coolant supplied to the lower surface of the substrate, a heated gas heated to a temperature not less than the boiling point of the low surface tension liquid is made into a thin layer form over the entire width of the lower surface of the substrate and sprayed to the lower surface of the substrate by moving the spray position in synchronization with movement of a boundary between the liquid film and the liquid film-removed region by expansion of the liquid film-removed region. Thereby, the coolant is selectively removed, thus making it possible to effectively heat the liquid film-removed region on the upper surface of the substrate which corresponds to a range at which the coolant has been removed to a temperature not less than the boiling point of the low surface tension liquid.

Therefore, according to the above-described method, it is possible to dry the upper surface of the substrate more effectively, while suppressing pattern collapse more effectively.

As the processing liquid and the low surface tension liquid, it is preferable to combine a processing liquid which contains water with a low surface tension liquid which contains an organic solvent lower in surface tension than water.

One embodiment of the present invention is a substrate processing apparatus which includes a substrate holding unit which holds a substrate horizontally, a substrate rotating unit which rotates the substrate held horizontally by the substrate holding unit around a vertical rotation axis which passes through a central portion of the substrate, a processing liquid supplying unit which supplies a processing liquid to an upper surface of the substrate, a gas supplying unit which supplies from the upper surface side of the substrate to the substrate a gas which contains vapor of a low surface tension liquid lower in surface tension than the processing liquid, a cooling unit which cools the substrate from the lower surface side of the substrate to a temperature lower than the boiling point of the low surface tension liquid, a heating unit which heats the substrate from the lower surface side of the substrate to a temperature not less than the boiling point of the low surface tension liquid, and a controller which controls the substrate holding unit, the substrate rotating unit, the processing liquid supplying unit, the gas supplying unit, the cooling unit and the heating unit, in which the controller executes a substrate holding step which holds the substrate horizontally, a liquid film forming step which supplies the processing liquid to the upper surface of the substrate to form a liquid film, a liquid film-removed region forming step which forms a liquid film-removed region in which the processing liquid is removed from a portion of the liquid film in the vicinity of a rotation center of the upper surface of the substrate, a liquid film-removed region expanding step which expands the liquid film-removed region from the rotation center outward in a radial direction, a vapor supplying step which supplies a gas that contains vapor of the low surface tension liquid from the upper surface side of the substrate to an edge portion of the inner circumference side of the liquid film adjacent to the liquid film-removed region in parallel with the liquid film-removed region expanding step, a cooling/heating step which heats the liquid film-removed region to a temperature not less than the boiling point of the low surface tension liquid, while cooling a portion of the liquid film on the substrate excluding the edge portion to a temperature lower than the boiling point of the low surface tension liquid from the lower surface side of the substrate, in parallel with the liquid film-removed region expanding step, a heating range expanding step which expands a range that heats the liquid film-removed region from the lower surface side of the substrate in synchronization with expansion of the liquid film-removed region, and a substrate rotating step which rotates the substrate around the rotation axis in parallel with the liquid film-removed region forming step, the liquid film-removed region expanding step, the vapor supplying step, the cooling/heating step and the heating range expanding step.

According to the above-described configuration, of the liquid film on the substrate, a periphery of the edge portion is made into a gas atmosphere which contains vapor of the low surface tension liquid, by which the low surface tension liquid contained in the gas is dissolved into the processing liquid at the edge portion of the liquid film. Therefore, a difference in concentration of the low surface tension liquid, that is, a difference in surface tension will develop between the edge portion of the liquid film and a bulk portion of the liquid film.

Further, in a state that the bulk portion of the liquid film is cooled to a temperature lower than the boiling point of the low surface tension liquid, the liquid film-removed region on the upper surface of the substrate is heated to a temperature not less than the boiling point of the low surface tension liquid. Thereby, an edge portion of the liquid film adjacent to the liquid film-removed region is raised in temperature by heat conduction via the substrate, thus causing a difference in temperature between the edge portion of the liquid film and the bulk portion of the liquid film.

Therefore, due to contraction actions of the liquid film resulting from the Marangoni effect based on a difference in surface tension between the edge portion of the liquid film and the bulk portion of the liquid film and a difference in temperature thereof, the processing liquid shows behavior of rising upward at the edge portion of the liquid film, resulting in a large contact angle formed by the liquid surface of the processing liquid at the liquid film boundary and the upper surface of the substrate.

Further, the liquid film-removed region on the upper surface of the substrate is heated from the lower surface side of the substrate to a temperature not less than the boiling point of the low surface tension liquid. Thereby, of the edge portion of the liquid film, at a portion of a solid/liquid interface directly in contact with the upper surface of the substrate adjacent to the liquid film-removed region, the processing liquid into which the low surface tension liquid has been dissolved in a high concentration is accelerated for evaporation. Therefore, the processing liquid shows behavior of rising upward at the edge portion of the liquid film, thus resulting in a large contact angle formed between the liquid surface of the processing liquid at the liquid film boundary and the upper surface of the substrate.

That is, in combination with contraction actions of the liquid film resulting from the Marangoni effect with evaporation actions at the part of solid/liquid interface, a contact angle formed between the liquid surface of the processing liquid at the liquid film boundary and the upper surface of the substrate can be made larger and also the liquid film-removed region can be smoothly expanded. Thus, it is possible to suppress pattern collapse more favorably than a case where the technique described in JP2013-131783A is adopted.

Further, the liquid film-removed region on the upper surface of the substrate is heated to a temperature not less than the boiling point of the low surface tension liquid, thereby suppressing condensation of the low surface tension liquid at the liquid film-removed region. Therefore, it is possible to suppress pattern collapse due to the fact that a liquid film of the low surface tension liquid which is thicker than the height of a pattern is formed by condensation at the liquid film-removed region.

Therefore, according to the above-described configuration, it is possible to dry the upper surface of the substrate while effectively suppressing pattern collapse.

In one embodiment of the present invention, the cooling unit includes a coolant supplying unit for supplying a coolant to the lower surface of the substrate, the heating unit includes a heated gas spraying unit for spraying a heated gas to the lower surface of the substrate and further includes a movement unit which moves a position on the lower surface of the substrate at which the heated gas is sprayed from the heated gas spraying unit. The controller executes, as the cooling/heating step, respectively a cooling step in which a coolant is supplied to the lower surface of the substrate substantially in its entirety to cool the liquid film to a temperature lower than the boiling point of the low surface tension liquid and a heating step in which a heated gas is sprayed to the lower surface of the substrate to heat the liquid film-removed region to a temperature not less than the boiling point of the low surface tension liquid. The controller executes, as the heating range expanding step, a spray position moving step in which a position on the lower surface of the substrate at which the heated gas is sprayed is moved in synchronization with movement of a boundary between the liquid film and the liquid film-removed region by expansion of the liquid film-removed region.

According to the above-described configuration, while the liquid film on the upper surface of the substrate is cooled by the coolant supplied to the lower surface of the substrate to a temperature lower than the boiling point of the low surface tension liquid, the coolant in a range corresponding to the liquid film-removed region on the upper surface of the substrate is selectively removed by spraying a heated gas which is heated to a temperature not less than the boiling point of the low surface tension liquid. Thereby, it is possible to effectively heat the liquid film-removed region on the upper surface of the substrate which corresponds to a range in which the coolant is removed to a temperature not less than the boiling point of the low surface tension liquid.

One embodiment of the present invention is a substrate processing apparatus which includes a substrate holding unit which holds a substrate horizontally, a processing liquid supplying unit which supplies a processing liquid to an upper surface of the substrate, a gas supplying unit which sprays a gas that contains vapor of a low surface tension liquid lower in surface tension than the processing liquid to the upper surface of the substrate in a thin layer form over the entire width of the upper surface of the substrate, an upper surface movement unit which moves a position on the upper surface of the substrate at which the gas is sprayed from the gas supplying unit, a coolant supplying unit which supplies a coolant to the lower surface of the substrate, a heated gas spraying unit which sprays a heated gas to the lower surface of the substrate in a thin layer form over the entire width of the lower surface of the substrate, a lower surface movement unit which moves a position on the lower surface of the substrate at which the heated gas is sprayed from the heated gas spraying unit, and a controller which controls the substrate holding unit, the processing liquid supplying unit, the gas supplying unit, the upper surface movement unit, the coolant supplying unit, the heated gas spraying unit and the lower surface movement unit, in which the controller executes a substrate holding step which holds the substrate horizontally, a liquid film forming step which supplies the processing liquid to the upper surface of the substrate to form a liquid film, a liquid film-removed region forming step in which the gas is sprayed to one end portion of the upper surface of the substrate in a thin layer form over the entire width of the upper surface of the substrate, thereby forming a liquid film-removed region in which the processing liquid is removed from a portion of the liquid film in the vicinity of the one end portion of the upper surface of the substrate, a liquid film-removed region expanding step in which a position at which the gas is sprayed is moved from the one end portion to the other end portion of the substrate, thereby expanding the liquid film-removed region, a cooling step in which a coolant is supplied to the lower surface of the substrate substantially in its entirety to cool the liquid film to a temperature lower than the boiling point of the low surface tension liquid, a heating step in which the heated gas is sprayed in a thin layer form over the entire width of the lower surface of the substrate parallel to the gas in the thin layer form to a position on the lower surface of the substrate which corresponds to the liquid film-removed region, thereby heating the liquid film-removed region to a temperature not less than the boiling point of the low surface tension liquid, and a spray position moving step in which a position on the lower surface of the substrate at which the heated gas is sprayed is moved in synchronization with movement of a boundary between the liquid film and the liquid film-removed region by expansion of the liquid film-removed region.

According to the above-described configuration, of the liquid film on the substrate, a periphery of the edge portion is made into a gas atmosphere which contains vapor of the low surface tension liquid, by which the low surface tension liquid contained in the gas is dissolved into the processing liquid at the edge portion of the liquid film. Therefore, a difference in concentration of the low surface tension liquid, that is, a difference in surface tension will develop between the edge portion of the liquid film and the bulk portion of the liquid film.

Further, in a state that the bulk portion of the liquid film is cooled to a temperature lower than the boiling point of the low surface tension liquid, the liquid film-removed region on the upper surface of the substrate is heated to a temperature not less than the boiling point of the low surface tension liquid. Thereby, the edge portion of the liquid film adjacent to the liquid film-removed region is raised in temperature by heat conduction through the substrate to develop a difference in temperature between the edge portion of the liquid film and the bulk portion of the liquid film.

Therefore, due to contraction actions of the liquid film resulting from the Marangoni effect on the basis of a difference in surface tension between the edge portion of the liquid film and the bulk portion of the liquid film and a difference in temperature thereof, the processing liquid shows behavior of rising upward at the edge portion of liquid film, thus resulting in a large contact angle formed between the liquid surface of the processing liquid at the liquid film boundary and the upper surface of the substrate.

Further, the liquid film-removed region on the upper surface of the substrate is heated from the lower surface side of the substrate up to a temperature not less than the boiling point of the low surface tension liquid. Thereby, of the edge portion of the liquid film, at a portion of a solid/liquid interface directly in contact with the upper surface of the substrate adjacent to the liquid film-removed region, the processing liquid into which the low surface tension liquid has dissolved at a high concentration is accelerated for evaporation. Therefore, the processing liquid shows behavior of rising upward at the edge portion of the liquid film, thus resulting in a large contact angle formed between the liquid surface of the processing liquid at the liquid film boundary and the upper surface of the substrate.

That is, in combination with contraction actions of the liquid film resulting from the Marangoni effect with evaporation actions at the part of the solid/liquid interface, a contact angle formed between the liquid surface of the processing liquid at the liquid film boundary and the upper surface of the substrate can be made larger. It is also possible to expand the liquid film-removed region smoothly and suppress pattern collapse more favorably than a case where the technique described in JP2013-131783A is adopted.

Further, the liquid film-removed region on the upper surface of the substrate is heated to a temperature not less than the boiling point of the low surface tension liquid, thereby suppressing condensation of the low surface tension liquid at the liquid film-removed region. As a result, it is possible to suppress pattern collapse due to the fact that a liquid film of the low surface tension liquid which is thicker than the height of a pattern is formed by condensation at the liquid film-removed region.

Therefore, according to the above-described configuration, it is possible to dry the upper surface of the substrate while effectively suppressing pattern collapse.

The above and other objects, features and effects of the present invention will become more apparent from the following detailed description of the preferred embodiments with reference to the attached drawings.

DETAILED DESCRIPTION OF THE PREFERRED EMBODIMENTS

Figure 1:
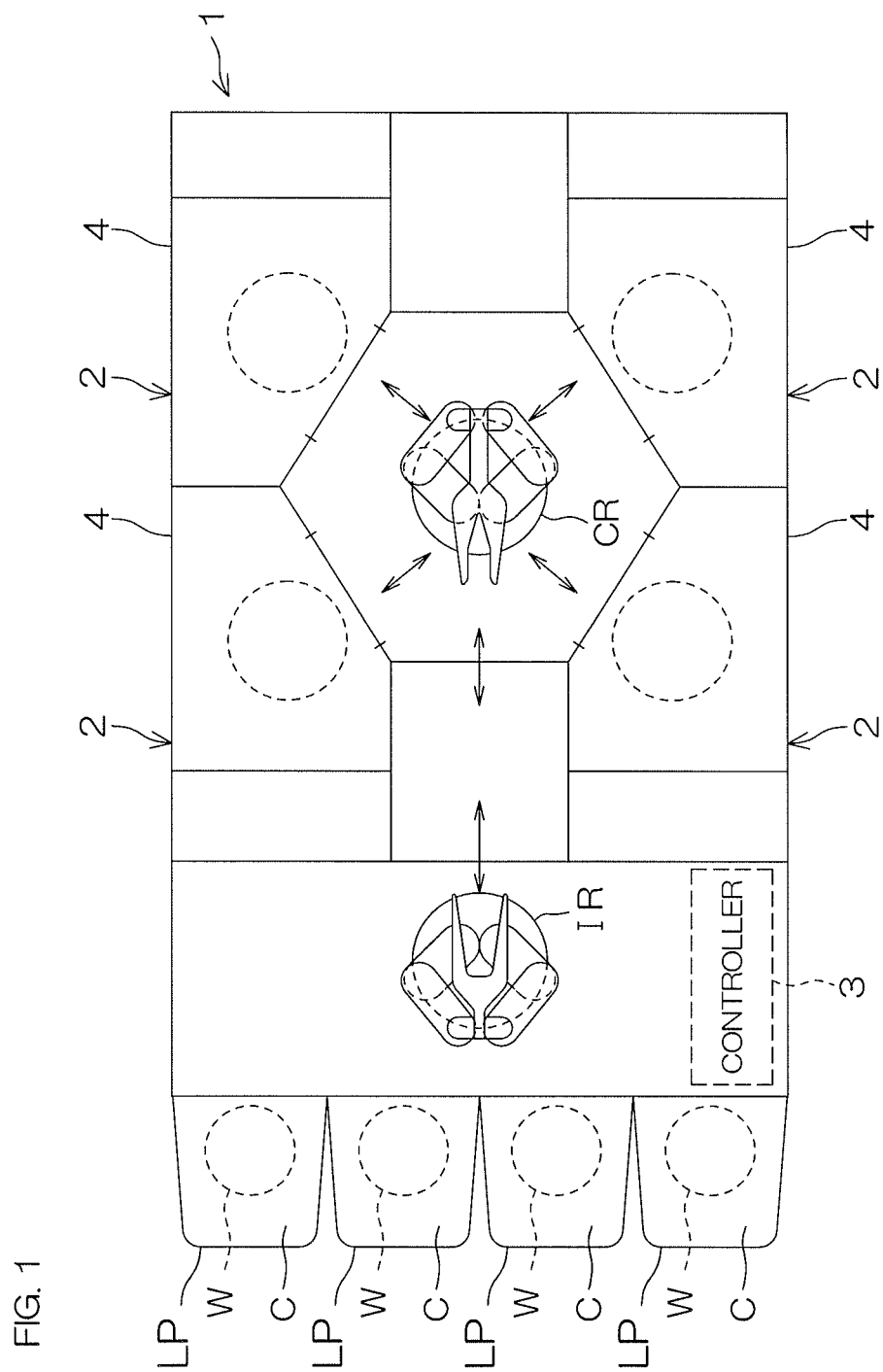
FIG. 1 is an illustrative plan view for describing a layout of a substrate processing apparatus according to a first preferred embodiment of the present invention.

FIG. 1 is an illustrative plan view for describing a layout of a substrate processing apparatus 1 according to the first preferred embodiment of the present invention.

The substrate processing apparatus 1 is a single substrate processing type apparatus which processes substrates W such as silicon wafers one at a time. In this preferred embodiment, the substrate W is a circular plate-shaped substrate. The substrate processing apparatus 1 includes a plurality of processing units 2 which process the substrate W by a processing liquid and a load port LP on which a carrier C for housing the plurality of substrates W to be processed by the processing units 2 is placed. The substrate processing apparatus 1 further includes transfer robots IR and CR which transfer a substrate W between the load port LP and the processing unit 2, and a controller 3 which controls the substrate processing apparatus 1. The transfer robot IR transfers a substrate W between the carrier C and the transfer robot CR. The transfer robot CR transfers a substrate W between the transfer robot IR and the processing unit 2. Each of the plurality of processing units 2 has, for example, a similar configuration.

Figure 2:
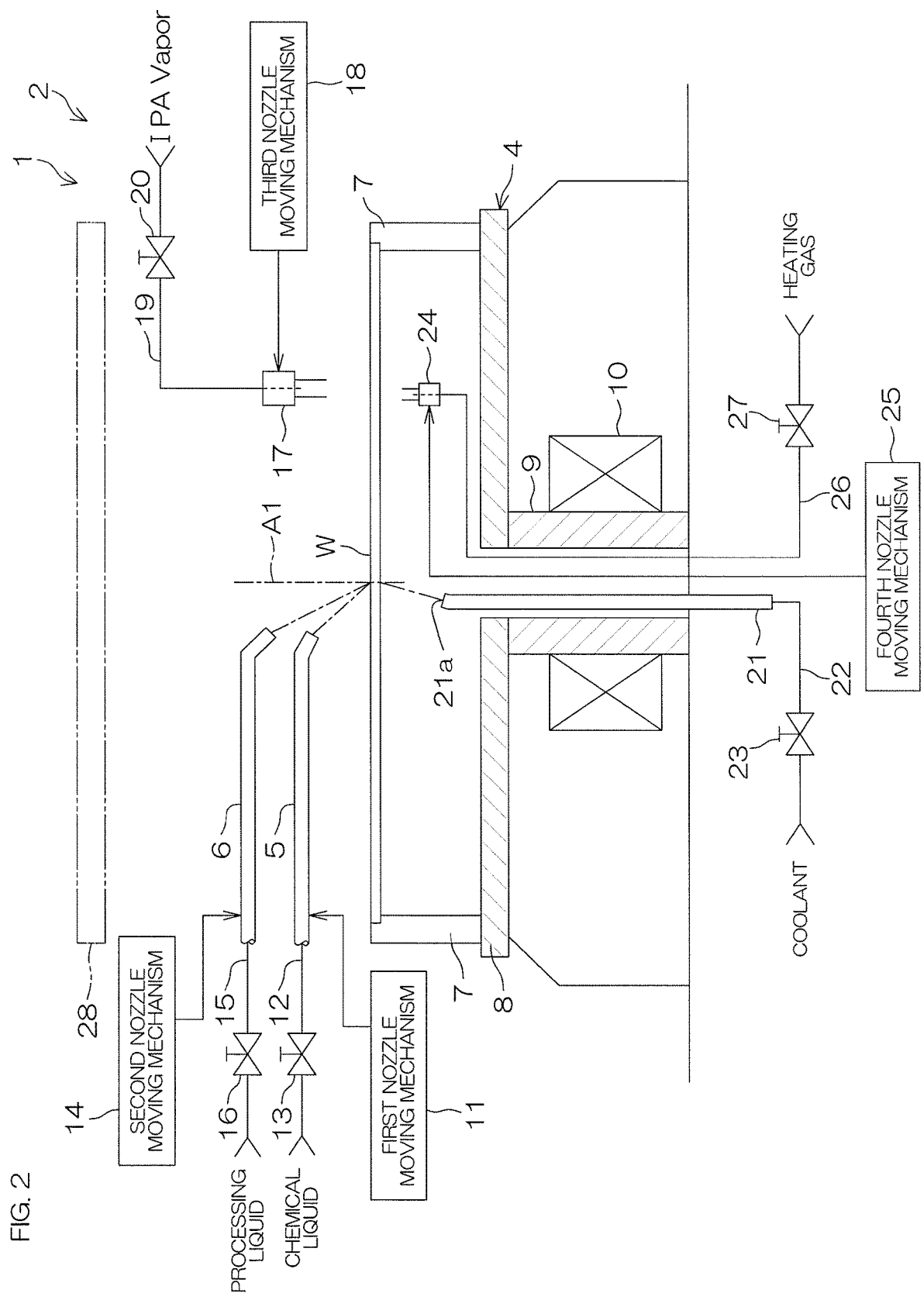
FIG. 2 is a schematic view for describing a brief configuration of a processing unit provided at the substrate processing apparatus.

FIG. 2 is a schematic view for describing a brief configuration of the processing unit 2 provided at the substrate processing apparatus 1.

The processing unit 2 includes a spin chuck 4 which holds a single substrate W in a horizontal attitude to rotate the substrate W around a vertical rotation axis A1 which passes through the center of the substrate W. The processing unit 2 further includes a chemical liquid supply nozzle 5 which supplies a chemical liquid such as hydrofluoric acid to an upper surface of the substrate W held by the spin chuck 4 and a processing liquid supply nozzle 6 which supplies a processing liquid that contains water to the upper surface of the substrate W held by the spin chuck 4. The processing liquid supply nozzle 6 is one example of the processing liquid supplying unit which supplies a processing liquid that contains water.

The spin chuck 4 includes a chuck pin 7, a spin base 8, a rotation shaft 9, and a spin motor 10 for rotating a substrate W around the rotation axis A1. The chuck pin 7 and the spin base 8 are each one example of the substrate holding unit which holds the substrate W horizontally. The rotation shaft 9 and the spin motor 10 are each one example of the substrate rotating unit which rotates the substrate W held by the chuck pin 7 and the spin base 8 around the rotation axis A1.

The rotation shaft 9 extends along the rotation axis A1 in a vertical direction and is a hollow shaft in this preferred embodiment. An upper end of the rotation shaft 9 is connected to a center of a lower surface of the spin base 8. The spin base 8 has a circular disk shape along a horizontal direction. The plurality of chuck pins 7 for gripping a substrate W are disposed in a circumferential direction, with an interval kept, at a circumferential edge portion of the upper surface of the spin base 8. The spin motor 10 includes an electric motor which rotates the substrate W, the chuck pin 7, the spin base 8 and the rotation shaft 9 integrally around the rotation axis A1, for example, by applying a rotation force to the rotation shaft 9.

The chemical liquid supply nozzle 5 is moved by a first nozzle moving mechanism 11, for example, in a horizontal direction (a direction perpendicular to the rotation axis A1). The chemical liquid supply nozzle 5 is allowed to move between a central portion which faces a rotation center position on the upper surface of the substrate W and a retracted position which does not face the upper surface of the substrate W by horizontal movement. The rotation center position on the upper surface of the substrate W is a position which intersects with the rotation axis A1 on the upper surface of the substrate W. The retracted position which does not face the upper surface of the substrate W is an external position of the spin base 8 in a plan view. A chemical liquid supply pipe 12 is connected to the chemical liquid supply nozzle 5. A chemical liquid valve 13 for opening and closing a flow channel thereof is placed on the chemical liquid supply pipe 12.

The chemical liquid which is supplied to the chemical liquid supply nozzle 5 is not limited to hydrofluoric acid but may be a liquid which contains at least one of sulfuric acid, acetic acid, nitric acid, hydrochloric acid, hydrofluoric acid, ammonia water, hydrogen peroxide water, an organic acid (for example, citric acid and oxalic acid), organic alkali (for example, TMAH: tetramethylammonium hydroxide), a surfactant and a corrosion preventive agent.

The processing liquid supply nozzle 6 is moved by a second nozzle moving mechanism 14, for example, in a horizontal direction (a direction perpendicular to the rotation axis A1). The processing liquid supply nozzle 6 is allowed to move between the central portion which faces the rotation center position on the upper surface of the substrate W and the retracted position which does not face the upper surface of the substrate W by horizontal movement. A processing liquid supply pipe 15 is connected to the processing liquid supply nozzle 6. A processing liquid valve 16 for opening and closing a flow channel thereof is placed on the processing liquid supply pipe 15.

The processing liquid supplied to the processing liquid supply nozzle 6 is, for example, water. Water is, for example, deionized water (DIW). However, water is not limited to deionized water but may be any one of carbonated water, electrolysis ionized water, hydrogen water, ozone water, and hydrochloric acid water with a diluted concentration (for example, about 10 to 100 ppm).

The processing unit 2 further includes a gas supply nozzle 17 capable of moving above the substrate W held by the spin chuck 4. The gas supply nozzle 17 is one example of the gas supplying unit in which a gas that contains vapor of the low surface tension liquid lower in surface tension than water is sprayed from the upper surface side of the substrate W and supplied to the substrate W held by the chuck pin 7 and the spin base 8.

The gas supply nozzle 17 is moved by a third nozzle moving mechanism 18 in a horizontal direction (a direction perpendicular to the rotation axis A1) and in a vertical direction (a direction parallel to the rotation axis A1). The gas supply nozzle 17 is allowed to move between the central portion which faces the rotation center position on the upper surface of the substrate W and the retracted position which does not face the upper surface of the substrate W by horizontal movement. The third nozzle moving mechanism 18 includes, for example, a rotary shaft along a vertical direction, a nozzle arm which is connected to the rotary shaft to extend horizontally, and an arm driving mechanism which drives the nozzle arm. The arm driving mechanism allows the rotary shaft to move rotationally around a vertical rotary axis, by which the nozzle arm is moved horizontally, and the rotary shaft is elevated and lowered along a vertical direction to move the nozzle arm up and down. The gas supply nozzle 17 is fixed to the nozzle arm. In response to the nozzle arm which is moved horizontally and elevated and lowered, the gas supply nozzle 17 moves in a horizontal direction and in a vertical direction.

One example of the low surface tension liquid is IPA. However, the low surface tension liquid is not limited to IPA but also includes an organic solvent other than IPA which is smaller in surface tension than water and will not chemically react with a substrate W or a pattern formed on the substrate W. More specifically, a liquid which contains at least any one of IPA, HFE (hydrofluoroether), methanol, ethanol, acetone and trans-1,2-dichloroethylene may be used as the low surface tension liquid.

It is not necessary that the gas supplied from the gas supply nozzle 17 is exclusively composed of vapor of a low surface tension liquid but may be a mixed gas which is mixed with other components. The gas may be, for example, a mixed gas that contains vapor of IPA and an inert gas. An inert gas includes nitrogen gas ($N_2$). However, an inert gas is not limited to nitrogen gas but may be any gas which is inert to a substrate W and a pattern and may include a rare gas such as argon, for example.

The gas which is supplied from the gas supply nozzle 17 may be at any temperature not less than the boiling point of the low surface tension liquid which is contained in the gas. For example, where the gas is vapor of IPA or a mixed gas which is composed of vapor of IPA and an inert gas, the gas is preferably at a temperature of 80° C. to 90° C.

A gas supply pipe 19 is connected to the gas supply nozzle 17. A gas valve 20 for opening and closing a flow channel thereof is placed on the gas supply pipe 19.

The processing unit 2 further includes a coolant supply nozzle 21 which supplies a coolant for cooling a substrate W at the lower surface of the substrate W held by the spin chuck 4. The coolant supply nozzle 21 is one example of the coolant supplying unit which cools the substrate W held by the chuck pin 7 and the spin base 8 from the lower surface side of the substrate W to a temperature lower than the boiling point of the low surface tension liquid.

The coolant supply nozzle 21 supplies a coolant to the lower surface of the substrate W substantially in its entirety, thereby cooling the liquid film on the upper surface of the substrate W. The coolant supply nozzle 21 is inserted through the rotation shaft 9 and provided at an upper end with a discharge port 21a which faces a center of a lower surface of the substrate W.

In this preferred embodiment, the coolant supply nozzle 21 supplies a coolant from the discharge port 21a to the center position on the lower surface of the substrate W, while rotating the substrate W. The supplied coolant is fed over to the lower surface of the substrate W substantially in its entirety by action of centrifugal force, by which the substrate W and the liquid film on the upper surface of the substrate W are cooled to a temperature lower than the boiling point of the low surface tension liquid. The rotation center position of the lower surface of the substrate W is a position where the lower surface of the substrate intersects the rotation axis A1.

The coolant is supplied to the coolant supply nozzle 21 from a coolant supply source via a coolant supply pipe 22. The supplied coolant is, for example, cold water. Cold water is water lower in temperature than a room temperature and, for example, water at a temperature of 1° C. to 10° C. However, the coolant is not limited to cold water but may be any liquid which is able to cool the substrate W and also will not chemically react with the substrate W or a pattern. A coolant valve 23 for opening and closing a flow channel thereof is placed on the coolant supply pipe 22.

The processing unit 2 further includes a heated gas spraying nozzle 24 which is able to move below the substrate W held by the spin chuck 4. The heated gas spraying nozzle 24 is one example of the heated gas spraying unit which sprays a heated gas to the lower surface of the substrate W held by the chuck pin 7 and the spin base 8.

The heated gas spraying nozzle 24 is moved by a fourth nozzle moving mechanism 25 in a horizontal direction (a direction perpendicular to the rotation axis A1). The heated gas spraying nozzle 24 is allowed to move between a central portion which faces a rotation center position on the lower surface of the substrate W and a circumferential edge position which faces a circumferential edge portion of the lower surface of the substrate W by horizontal movement. When the heated gas spraying nozzle 24 is positioned at the central portion, a heated gas is sprayed at the rotation center position on the lower surface of the substrate W. On the other hand, when the heated gas spraying nozzle 24 is positioned at the circumferential edge position, a heated gas is sprayed at the circumferential edge portion of the lower surface of the substrate W.

The fourth nozzle moving mechanism 25 is one example of the movement unit for moving a position at which a heated gas is sprayed from the heated gas spraying nozzle 24. The fourth nozzle moving mechanism 25 includes, for example, a nozzle arm which is connected to a rotary shaft along a vertical direction to extend horizontally and an arm driving mechanism which drives the nozzle arm. The heated gas spraying nozzle 24 is fixed to the nozzle arm.

In the preferred embodiment, the arm driving mechanism is installed below the spin chuck 4. The rotary shaft is inserted through the rotation shaft 9. The nozzle arm and the heated gas spraying nozzle 24 are installed above the spin base 8 and also below the substrate W held by the chuck pin 7 and the spin base 8. The arm driving mechanism allows the nozzle arm to move back and forth in a direction which intersects with the rotation direction of the substrate W (for example, in a radial direction of the substrate W), thereby moving the nozzle arm horizontally. In response to horizontal movement of the nozzle arm, the heated gas spraying nozzle 24 moves in a horizontal direction. Further, the fourth nozzle moving mechanism 25 may be provided not only with a configuration which moves the heated gas spraying nozzle 24 horizontally but also provided with a mechanism which moves the heated gas spraying nozzle 24 in a vertical direction.

A heated gas supply pipe 26 is inserted through the rotation shaft 9 and connected to the heated gas spraying nozzle 24. A heated gas valve 27 for opening and closing a flow channel thereof is placed on the heated gas supply pipe 26. The heated gas includes heated nitrogen gas as one example. However, the heated gas is not limited to nitrogen gas but may be any gas which is inert to the substrate W and a pattern and may include a rare gas such as argon, for example. The heated gas supplied from the heated gas spraying nozzle 24 may be at a temperature not less than the boiling point of the low surface tension liquid. For example, where the low surface tension liquid is IPA, the heated gas is preferably at a temperature of 80° C. to 95° C.

As shown by the double dotted and dashed line in FIG. 2, the processing unit 2 may include a shielding plate 28 as a facing member which faces the substrate W to shield (isolate) an atmosphere between the substrate W and the plate from a peripheral atmosphere. The shielding plate 28 is formed in a circular plate-shape which is substantially equal in diameter to or larger than the substrate W and disposed substantially horizontally above the spin chuck 4. The shielding plate 28 is able to move at any position (height) from a lower position to an upper position. When the shielding plate 28 is at a position sufficiently close to the upper surface of the substrate W, a space between the shielding plate 28 and the substrate W is isolated by the shielding plate 28 from a peripheral atmosphere (outside the space between the shielding plate 28 and the substrate W)

Figure 3:
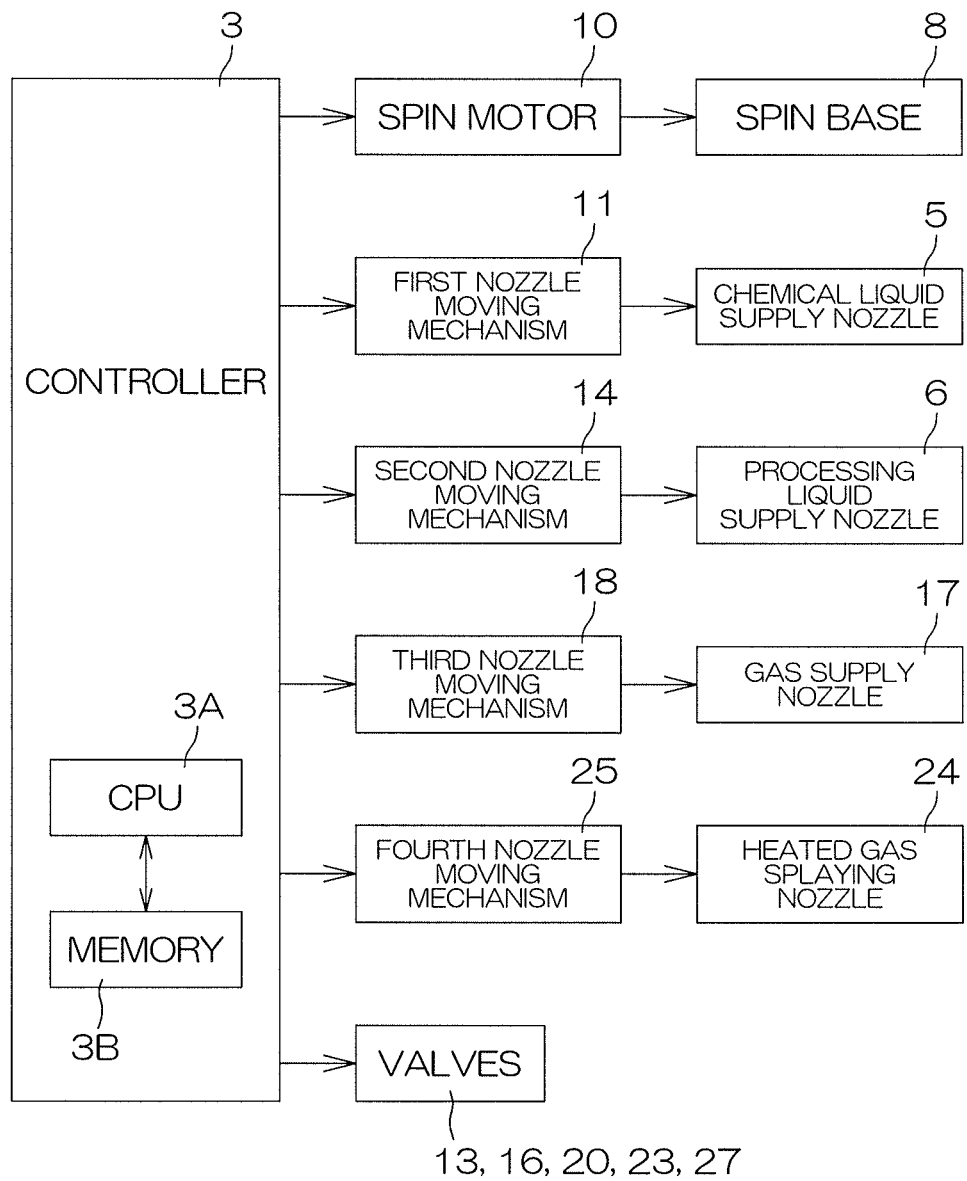
FIG. 3 is a block diagram for describing an electrical configuration of a major portion of the substrate processing apparatus.

FIG. 3 is a block diagram for describing an electrical configuration of a major portion of the substrate processing apparatus 1.

The substrate processing apparatus 1 includes a controller 3. The controller 3 is provided with a microcomputer to control a control target provided at the substrate processing apparatus 1 according to a predetermined control program. More specifically, the controller 3 includes a processor (CPU) 3A and a memory 3B which stores the control program and is configured so as to perform various types of control for processing a substrate by execution of the control program by the processor 3A. In particular, the controller 3 is programmed so as to control the spin motor 10, the first nozzle moving mechanism 11, the second nozzle moving mechanism 14, the third nozzle moving mechanism 18, the fourth nozzle moving mechanism 25, and the valves 13, 16, 20, 23, 27.

Figure 4:
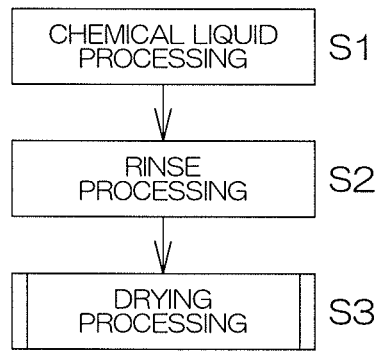
FIG. 4 is a flowchart for describing an example of substrate processing by the processing unit.

FIG. 4 is a flowchart for describing an example of substrate processing by the processing unit 2.

In the substrate processing by the processing unit 2, a chemical liquid processing step is first executed (Step S1). In the chemical liquid processing step, at first, the controller 3 drives the spin motor 10 to rotate the spin base 8, thereby starting to rotate the substrate W. In the chemical liquid processing step, the spin base 8 is rotated at a predetermined chemical liquid rotation speed. The chemical liquid rotation speed is, for example, 800 rpm to 1000 rpm.

Then, the controller 3 controls the first nozzle moving mechanism 11 to dispose the chemical liquid supply nozzle 5 at a chemical liquid processing position above the substrate W. The chemical liquid processing position is, for example, a position at which a chemical liquid discharged from the chemical liquid supply nozzle 5 can be placed at a rotation center position on the upper surface of the substrate W. Then, the controller 3 opens the chemical liquid valve 13. Thereby, the chemical liquid is supplied from the chemical liquid supply nozzle 5 to the upper surface of the substrate W which is in a rotation state. The supplied chemical liquid is fed over to the upper surface of the substrate W substantially in its entirety by action of centrifugal force.

When a certain period of time has passed after the chemical liquid processing, the chemical liquid on the upper surface of the substrate W is replaced with a processing liquid, thereby executing a rinse processing step which removes the chemical liquid on the upper surface of the substrate W (Step S2).

Specifically, the controller 3 closes the chemical liquid valve 13 to stop supply of the chemical liquid from the chemical liquid supply nozzle 5. Then, the controller 3 moves the chemical liquid supply nozzle 5 to the retracted position.

Then, the controller 3 controls the second nozzle moving mechanism 14 to dispose the processing liquid supply nozzle 6 at a rinse processing position above the substrate W. The rinse processing position is, for example, a position at which a processing liquid discharged from the processing liquid supply nozzle 6 is placed at the rotation center position on the upper surface of the substrate W.

Then, the controller 3 opens the processing liquid valve 16. Thereby, the processing liquid is supplied from the processing liquid supply nozzle 6 toward the upper surface of the substrate W in a rotation state. The supplied processing liquid is fed over to the upper surface of the substrate W substantially in its entirety by action of centrifugal force to replace a chemical liquid.

In the rinse processing step, the controller 3 controls the spin motor 10, by which the spin base 8 is rotated at a predetermined processing liquid rotation speed. The processing liquid rotation speed is, for example, 800 rpm to 1200 rpm.

Then, the processing liquid is supplied continuously to the upper surface of the substrate W, by which a liquid film of the processing liquid is formed on the upper surface of the substrate W (liquid film forming step). The controller 3 controls the spin motor 10, by which the spin base 8 is rotated at a predetermined processing liquid film-forming speed. The processing liquid film-forming speed is, for example, 10 rpm to 20 rpm.

Then, when a certain period of time has passed after the rinse processing, there is executed a drying processing step in which the liquid film on the upper surface of the substrate W is removed (Step S3). The drying processing step is executed to complete the substrate processing by the processing unit 2.

Then, a detailed description will be given of the drying processing step by the processing unit 2.

Figure 5:
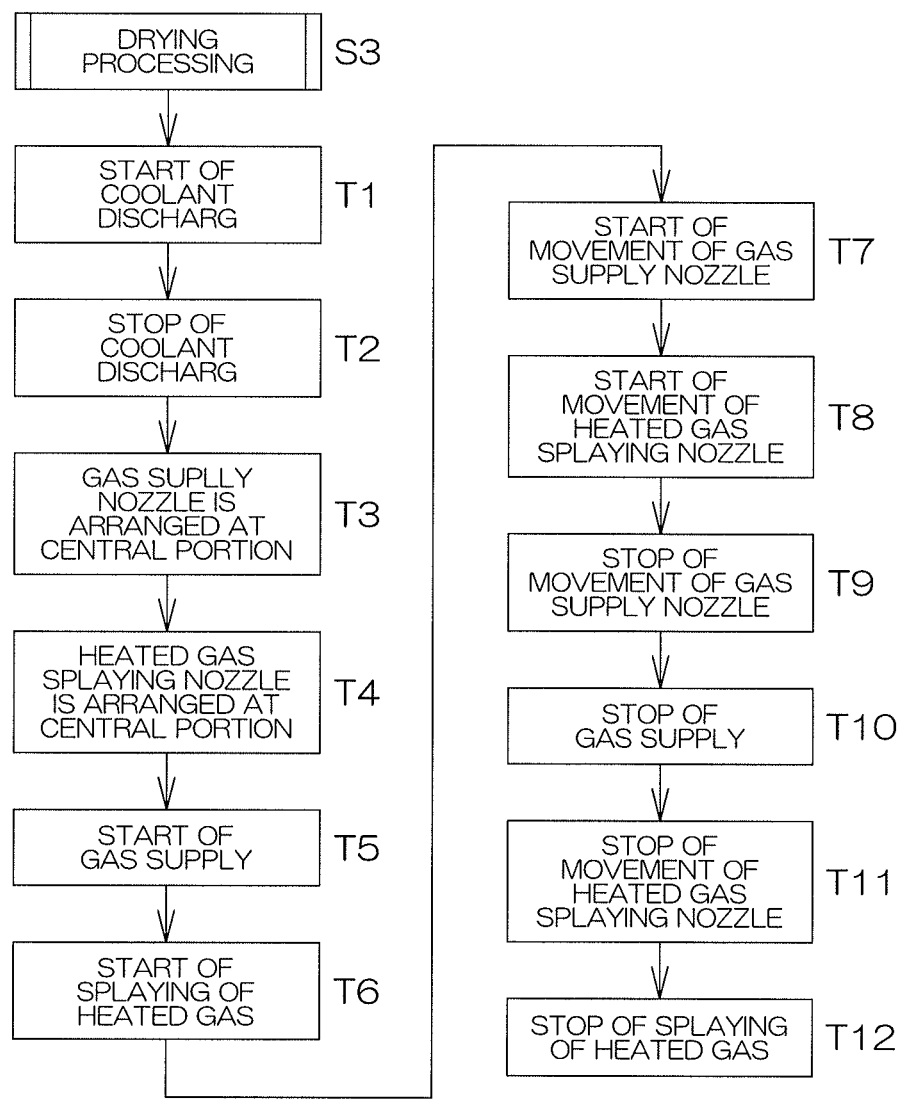
FIG. 5 is a flowchart for describing an example of the drying processing step by the processing unit.

FIG. 5 is a flowchart for describing an example of the drying processing step by the processing unit 2. FIG. 6A to FIG. 6D are each an illustrative sectional view for describing a mode of an example of the drying processing step.

In the drying processing step, at first, the controller 3 closes the processing liquid valve 16 to stop supply of the processing liquid from the processing liquid supply nozzle 6. Then, the controller 3 moves the processing liquid supply nozzle 6 to the retracted position.

Figure 6A:
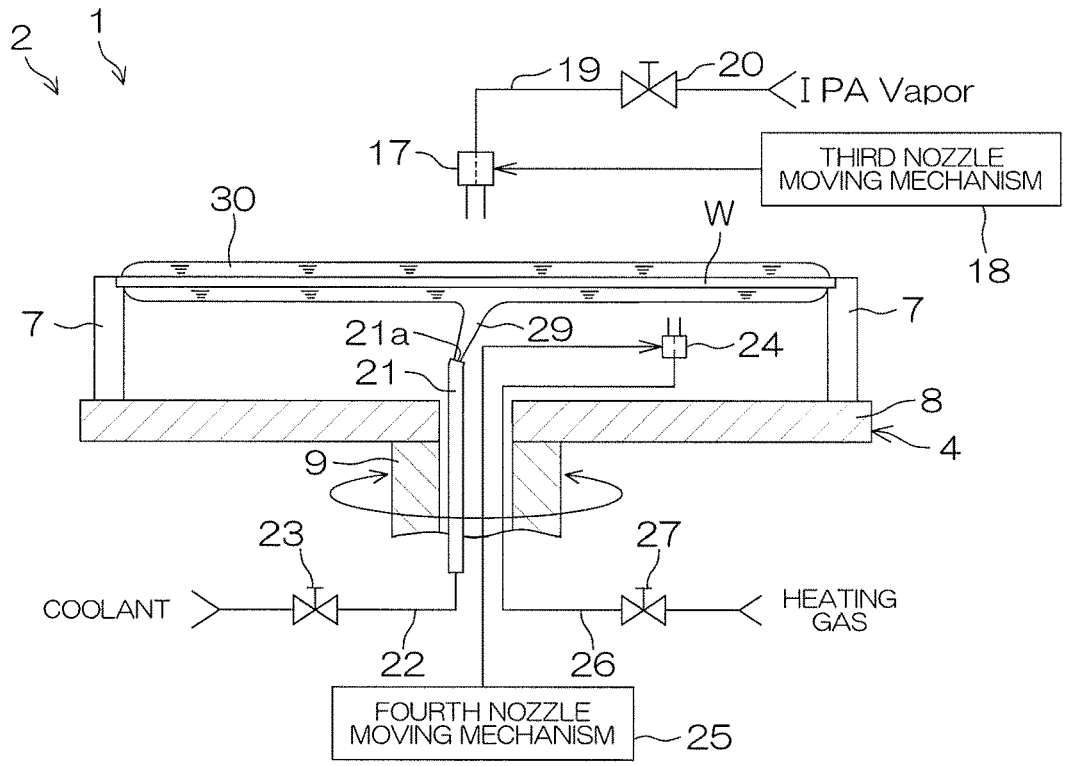
FIG. 6A is an illustrative sectional view for describing a mode of the drying processing step.

Then, controller 3 controls the spin motor 10 to rotate the spin base 8 at a predetermined coolant supplying speed. The coolant supplying speed is, for example, 10 rpm to 20 rpm. Then, the controller 3 opens the coolant valve 23, allowing the coolant supply nozzle 21 to supply a coolant (for example, cold water) 29 (Step T1). As shown in FIG. 6A, the coolant 29 is discharged from a discharge port 21a toward the rotation center position on the lower surface of the substrate W in a rotation state. The discharged coolant 29 is fed over to the lower surface of the substrate W substantially in its entirety by action of centrifugal force. Then, the coolant 29 is supplied continuously to the lower surface of the substrate W, by which the substrate W and a liquid film 30 on the upper surface of the substrate W are cooled to a temperature lower than the boiling point of the low surface tension liquid (cooling step).

After a certain period of the cooling step, the controller 3 closes the coolant valve 23 to stop supply of the coolant 29 from the coolant supply nozzle 21 (Step T2).

Figure 6B:
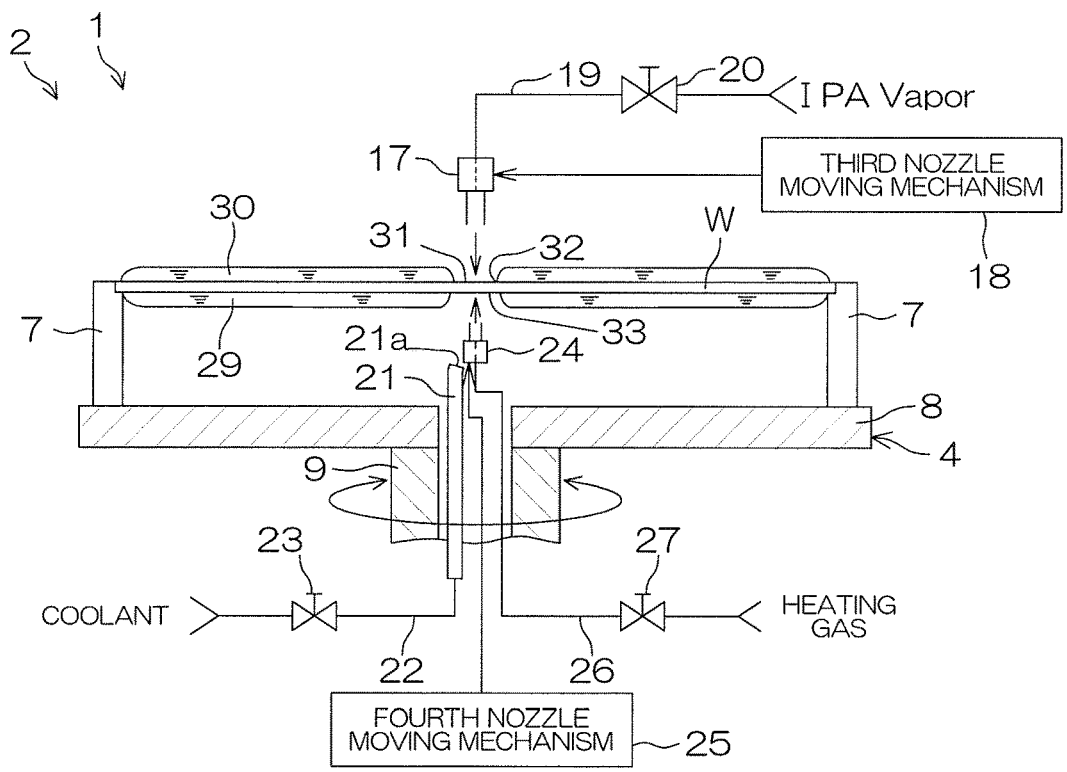
FIG. 6B is an illustrative sectional view for describing a mode of the drying processing step.
Figure 6C:
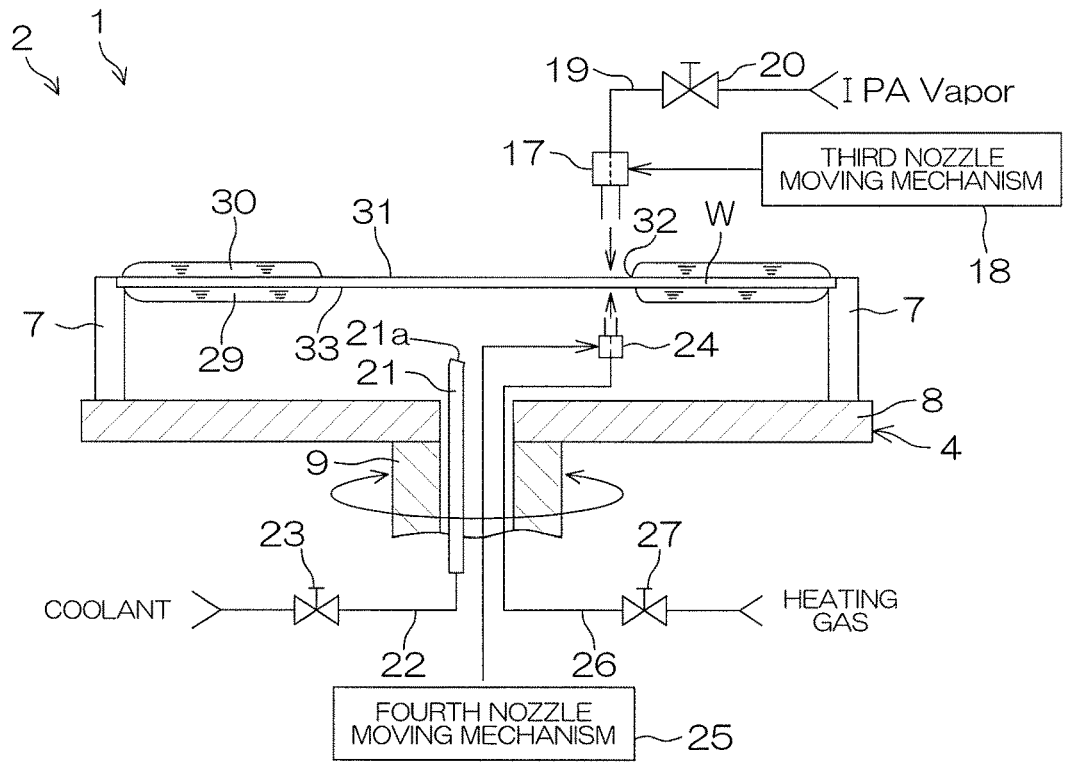
FIG. 6C is an illustrative sectional view for describing a mode of the drying processing step.
Figure 6D:
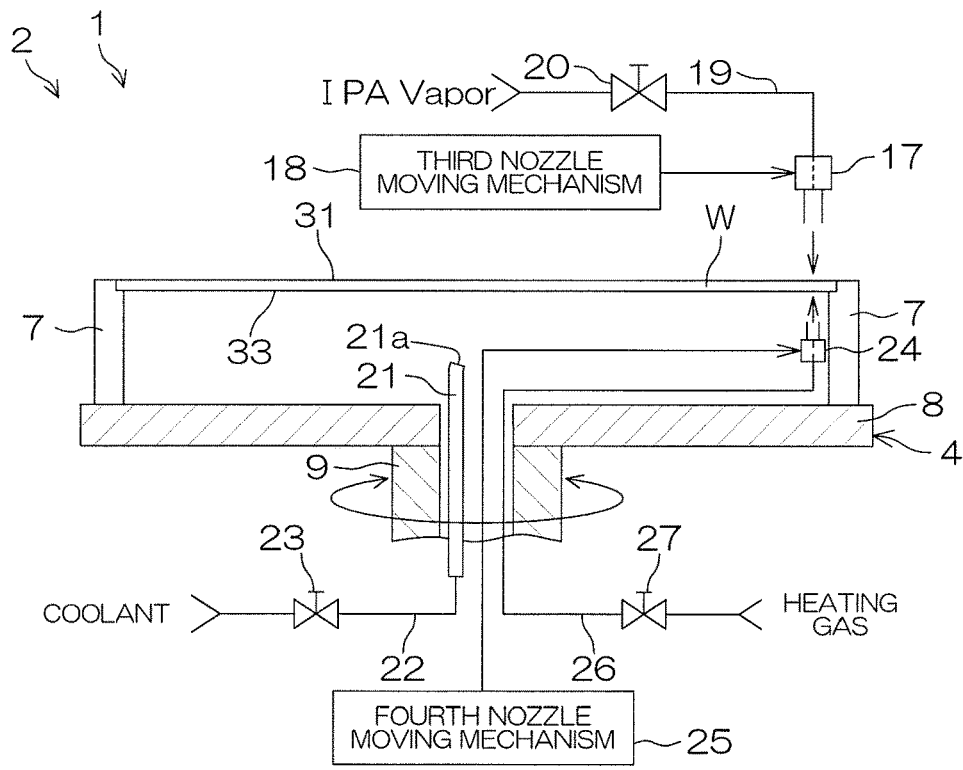
FIG. 6D is an illustrative sectional view for describing a mode of the drying processing step.

Then, as shown in FIG. 6B to FIG. 6D, a gas which contains vapor of the low surface tension liquid is sprayed at the rotation center position on the upper surface of the substrate W. Thus, there are executed a liquid film-removed region forming step in which a liquid film-removed region 31 which is a substantially circular shape is formed at a region including the rotation center of the upper surface of the substrate W and a liquid film-removed region expanding step in which the formed liquid film-removed region 31 is expanded outward in a radial direction.

Further, in parallel with the liquid film removed region forming step and the liquid film-removed region expanding step, a heated gas is sprayed at the rotation center position on the lower surface of the substrate W. Thus, there are executed a heating step in which the liquid film-removed region 31 on the upper surface of the substrate W is heated to a temperature not less than the boiling point of the low surface tension liquid and a spray position moving step in which a position at which the heated gas is sprayed is moved in synchronization with movement of a liquid film boundary 32 by expansion of the liquid film-removed region 31.

In detail, the controller 3 controls the third nozzle moving mechanism 18 to dispose the gas supply nozzle 17 at a gas supply start position above the substrate W (Step T3). The gas supply start position is, for example, a position at which a gas which contains vapor of the low surface tension liquid discharged from the gas supply nozzle 17 reaches the rotation center position on the upper surface of the substrate W.

Further, the controller 3 controls the fourth nozzle moving mechanism 25 to dispose the heated gas spraying nozzle 24 at a heated-gas spraying start position below the substrate W (Step T4). The heated-gas spraying start position is, for example, a position at which a heated gas discharged from the heated gas spraying nozzle 24 reaches the rotation center position on the lower surface of the substrate W.

Then, the controller 3 controls the spin motor 10 to rotate the spin base 8 at a predetermined liquid film-removed region forming speed. The liquid film-removed region forming speed is, for example, 10 rpm.

Then, the controller 3 opens the gas valve 20, thereby starting to supply a gas which contains vapor of the low surface tension liquid from the gas supply nozzle 17 toward the rotation center position on the upper surface of the substrate W in a rotation state (Step T5). When the gas is sprayed from the gas supply nozzle 17 toward the liquid film 30, a processing liquid which forms the liquid film 30 is pushed outward in a radial direction by spray of the gas from the rotation center position on the upper surface of the substrate W. Then, by added action of centrifugal force resulting from rotation of the substrate W, as shown in FIG. 6B, a liquid film-removed region 31 is formed in a substantially circular shape at a region including the rotation center of the upper surface of the substrate W (liquid film-removed region forming step).

Further, the controller 3 opens the heated gas valve 27, thereby starting to spray a heated gas heated to a temperature not less than the boiling point of the low surface tension liquid from the heated gas spraying nozzle 24 toward the rotation center position on the lower surface of the substrate W in a rotation state (Step T6). When the heated gas is sprayed, by added action of centrifugal force resulting from rotation of the substrate W, the coolant 29 at a range including the rotation center of the lower surface of the substrate W is selectively removed and also a range 33 from which the coolant 29 is removed is heated by the heated gas. As described previously, the coolant 29 is allowed to remain at a portion of the liquid film 30 which corresponds to the bulk portion excluding an edge portion. Therefore, the range 33 is considered to be a range which includes the liquid film-removed region 31 on the upper surface of the substrate W and the edge portion of the liquid film 30. An entire surface of the liquid film-removed region 31 on the upper surface of the substrate W included in the range 33 is selectively heated to a temperature not less than the boiling point of the low surface tension liquid (heating step).

Then, the controller 3 controls the spin motor 10 to rotate the spin base 8 at a predetermined liquid film-removed region expanding speed. The liquid film-removed region expanding speed is, for example, 50 rpm.

Then, the controller 3 controls the third nozzle moving mechanism 18, while continuously spraying a gas which contains vapor of the low surface tension liquid from the gas supply nozzle 17, thereby moving the gas supply nozzle 17 from the gas supply start position (rotation center position) outward of the substrate W in a radial direction at a predetermined speed (Step T7). When the gas supply nozzle 17 is moved outward in a radial direction, a position at which the gas is sprayed from the gas supply nozzle 17 to the upper surface of the substrate W moves from the rotation center outward in a radial direction. Then, in association with the movement, a processing liquid which forms the liquid film boundary 32 of the liquid film 30 surrounding the liquid film-removed region 31 is further pushed outward in a radial direction. Therefore, by added action of centrifugal force resulting from rotation of the substrate W, the liquid film-removed region 31 is expanded outward in a radial direction (liquid film-removed region expanding step).

The controller 3 also controls the fourth nozzle moving mechanism 25, while continuously spraying a heated gas from the heated gas spraying nozzle 24. That is, the controller 3 moves the heated gas spraying nozzle 24 from a heated gas spray starting position (rotation center position) outward of the substrate W in a radial direction at a predetermined speed in synchronization with movement of the liquid film boundary 32 by expansion of the liquid film-removed region 31 (Step T8). The heated gas spraying nozzle 24 is moved outward in a radial direction in synchronization with movement of the liquid film boundary 32, by which a position at which the heated gas is sprayed from the heated gas spraying nozzle 24 to the lower surface of the substrate W moves from the rotation center outward in a radial direction. Then, in association with the movement, the coolant 29 on the lower surface of the substrate W is removed, thus making it possible to expand the range 33 heated by the heated gas in synchronization with expansion of the liquid film-removed region 31 (heating range expanding step).

At a time point when the gas supply nozzle 17 has reached a gas supply completion position, the controller 3 controls the third nozzle moving mechanism 18 to stop movement of the gas supply nozzle 17 (Step T9). Then, the gas valve 20 is closed to stop spraying of a gas which contains vapor of the low surface tension liquid from the gas supply nozzle 17 (Step T10). The gas supply completion position is, for example, a position at which the gas which contains vapor of the low surface tension liquid discharged from the gas supply nozzle 17 reaches a circumferential edge of the upper surface of the substrate W. As the gas supply nozzle 17 reaches the gas supply completion position, the liquid film boundary 32 moves to the circumferential edge of the upper surface of the substrate W and, as shown in FIG. 6D, the liquid film-removed region 31 reaches a state of expanding to extend to the entire area of the upper surface of the substrate W.

Further, at a time point when the heated gas spraying nozzle 24 has reached a heated gas spraying completion position, the controller 3 controls the fourth nozzle moving mechanism 25 to stop movement of the heated gas spraying nozzle 24 (Step T11). Then, the heated gas valve 27 is closed to stop spray of the heated gas from the heated gas spraying nozzle 24 (Step T12). The heated gas spraying completion position is, for example, a position at which the heated gas discharged from the heated gas spraying nozzle 24 reaches a circumferential edge of the lower surface of the substrate W. The heated gas spraying nozzle 24 reaches the heated gas spraying completion position, by which the coolant 29 is removed entirely from the lower surface side of the substrate W to complete the drying processing step and also complete the substrate processing by the processing unit 2.

Figure 7A:
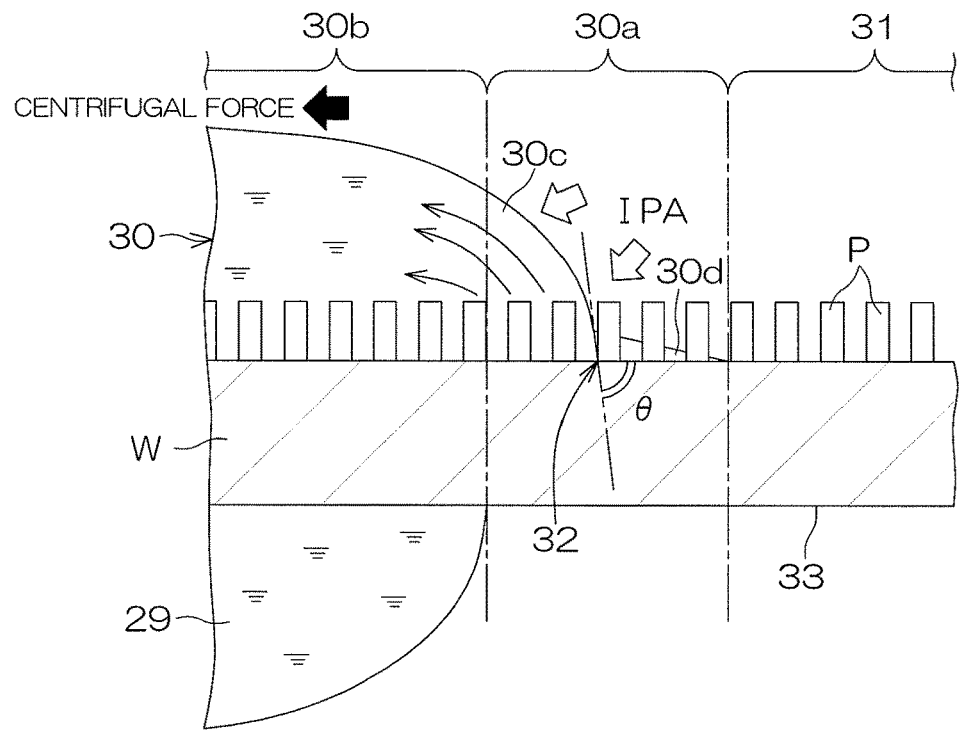
FIG. 7A is a schematic view for describing an example of a state in the vicinity of an edge portion of a liquid film in the drying processing step.

FIG. 7A is a schematic diagram for describing an example of a state in the vicinity of the edge portion 30a of the liquid film 30 in the drying processing step.

In general, the edge portion 30a of the liquid film 30 includes a thick film portion 30c formed integrally with the bulk portion 30b of the liquid film 30 and a thin film portion 30d. The thin film portion 30d occurs from behind the liquid film boundary 32 which is a rear end of the thick film portion 30c in a movement direction when the thick film portion 30c moves in association with expansion of the liquid film-removed region 31 (movement to the left direction in the drawing). The thin film portion 30d occurs when a portion of the processing liquid which constitutes the liquid film 30 is left on the front surface of the substrate W based on wettability with the substrate W or the low surface tension liquid contained in a gas supplied from the gas supply nozzle 17 undergoes condensation.

Collapse of a pattern P is largely affected by a contact angle θ formed between the liquid surface of the processing liquid at the liquid film boundary 32 which is a rear end of the thick film portion 30c thicker than the height of the pattern P of the edge portion 30a of the liquid film 30 and the upper surface of the substrate W.

Of the drying processing step, in the liquid film-removed region expanding step and the heating range expanding step, a periphery of the edge portion 30a of the liquid film 30 on the substrate W is made into an atmosphere of the gas supplied from the gas supply nozzle 17. Thereby, the low surface tension liquid (IPA) contained in the gas is dissolved into a processing liquid mainly at the edge portion 30a of the liquid film 30 as shown by the white arrows in the drawing. Therefore, a difference in concentration of the low surface tension liquid, that is, a difference in surface tension will develop between the edge portion 30a of the liquid film 30 and the bulk portion 30b. In detail, the low surface tension liquid shows a concentration distribution in which the concentration is highest at the thin film portion 30d in the edge portion 30a of the liquid film 30 and gradually decreased subsequently from the thick film portion 30c to the bulk portion 30b.

Further, in general, the low surface tension liquid is lower in boiling point than the processing liquid which is substantially water. Therefore, on the basis of the concentration distribution of the low surface tension liquid, the liquid film 30 shows such a tendency that the boiling point is lowest at the thin film portion 30d in the edge portion 30a and gradually increased subsequently from the thick film portion 30c to the bulk portion 30b. For example, where the processing liquid which forms the liquid film 30 is water, the boiling point of the bulk portion 30b of the liquid film 30 is close to 100° C. which is the boiling point of water. For example, where the low surface tension liquid is IPA, the boiling point of the thin film portion 30d in the edge portion 30a of the liquid film 30 is close to 82.4° C. which is the boiling point of IPA. Then, the thick film portion 30c shows such a tendency that the boiling point thereof is intermediate between them and lower at the thin film portion 30d and higher at the bulk portion 30b side.

Further, the bulk portion 30b of the liquid film 30 excluding the edge portion 30a of the liquid film 30 is cooled to a temperature lower than the boiling point of the low surface tension liquid by the coolant 29 supplied to the lower surface of the substrate W. Further, an entire surface of the liquid film-removed region 31 on the upper surface of the substrate W is heated to a temperature not less than the boiling point of the low surface tension liquid from the lower surface side of the substrate W. Thereby, a portion from the thin film portion 30d of the liquid film 30 adjacent to the liquid film-removed region 31 to the thick film portion 30c is raised in temperature by heat conduction via the substrate W, thus developing a difference in temperature from the bulk portion 30b of the liquid film 30. In detail, the liquid film 30 shows a temperature distribution in which the temperature is highest at the thin film portion 30d of the edge portion 30a and gradually decreased subsequently from the thick film portion 30c to the bulk portion 30b.

Therefore, contraction actions of the liquid film 30 by the Marangoni effect on the basis of a difference in surface tension and a difference in temperature will develop between the edge portion 30a of the liquid film 30 and the bulk portion 30d subsequent thereto. Then, by the contraction actions, the processing liquid shows behavior of rising upward as shown by solid line arrows in the drawing at the thick film portion 30c of the edge portion 30a of the liquid film 30.

Further, an entire surface of the liquid film-removed region 31 on the upper surface of the substrate W is heated to a temperature not less than the boiling point of the low surface tension liquid from the lower surface side of the substrate W, by which the processing liquid into which the low surface tension liquid has been dissolved at a high concentration to lower the boiling point is accelerated for evaporation. In detail, of the edge portion 30a of the liquid film 30, at the thin film portion 30d directly in contact with the upper surface of the substrate W adjacent to the liquid film-removed region 31 and, of the thick film portion 30d, at a solid/liquid interface portion directly in contact with the thin film portion 30d and the upper surface of the substrate W, evaporation of the processing liquid is accelerated. Therefore, due to actions of evaporation at the solid/liquid interface portion, of the edge portion 30a of the liquid film 30, at the thick film portion 30c, the processing liquid shows behavior of rising upward as shown in the solid line arrows in the drawing.

Further, action of centrifugal force resulting from rotation of the substrate W shown by the black arrow in the drawing are also applied to the liquid film 30.

Therefore, in combination with contraction actions of the liquid film 30 by the Marangoni effect, evaporation actions at the solid/liquid interface portion and action of centrifugal force resulting from rotation of the substrate W, it is possible to make larger a contact angle θ formed between the liquid surface of the processing liquid at the liquid film boundary 32 and the upper surface of the substrate W.

Further, the liquid film-removed region 31 can be smoothly expanded by action of centrifugal force resulting from rotation of the substrate W.

In addition, an entire surface of the liquid film-removed region 31 on the upper surface of the substrate W is heated to a temperature not less than the boiling point of the low surface tension liquid, by which the processing liquid is accelerated for evaporation at the thin film portion 30d directly in contact with the upper surface of the substrate W adjacent to the liquid film-removed region 31. Further, condensation of the low surface tension liquid at the thin film portion 30d is suppressed by accelerated evaporation.

Therefore, it is also possible to reduce the thickness of the thin film portion 30d as much as possible and suppress the effect from the thin film portion 30d on collapse of the pattern P.

It is, thus, possible to dry the upper surface of the substrate W while effectively suppressing collapse of the pattern P.

Figure 7B:
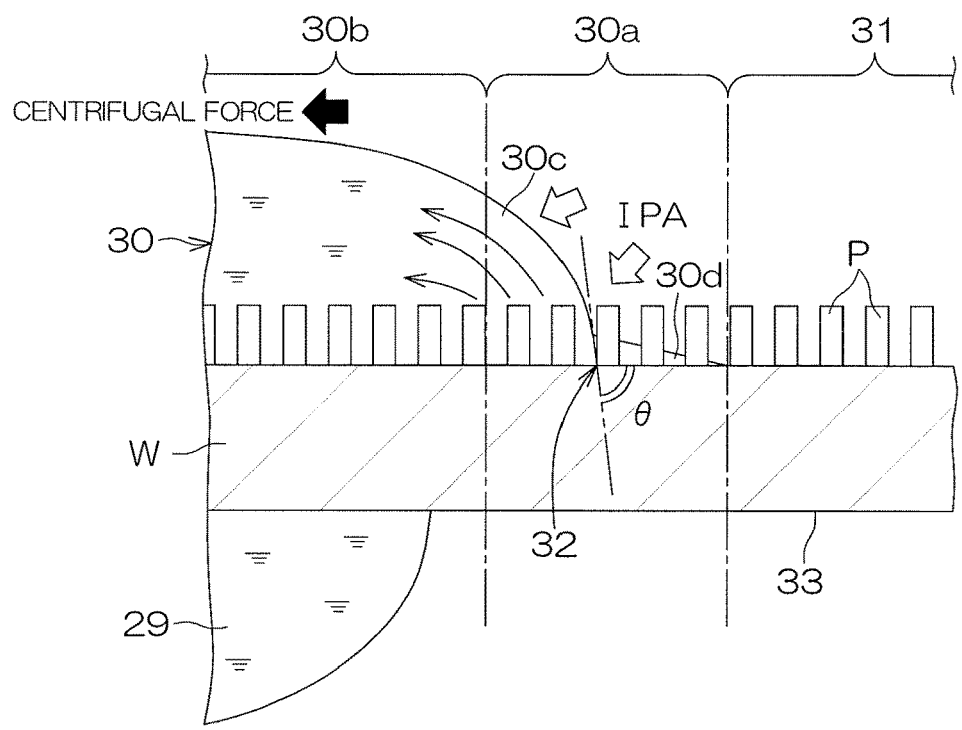
FIG. 7B is a schematic view for describing another example of a state in the vicinity of the edge portion of the liquid film in the drying processing step.

It is noted that, in the liquid film-removed region expanding step and the heating range expanding step, for example, as shown in FIG. 7B, the range 33 on the lower surface of the substrate W which is heated by spraying a heated gas to remove the coolant 29 may be expanded up to the bulk portion 30b of the liquid film 30 adjacent to the edge portion 30a. Further, the range 33 may be expanded by spraying the heated gas ahead of movement of the edge portion 30a of the liquid film 30 in association with expansion of the liquid film-removed region 31 on the upper surface of the substrate W.

The liquid film 30 is large in heat capacity and, therefore, where heating from the lower surface side of the substrate W is performed slightly ahead, it is possible to dry the upper surface of substrate W, while effectively suppressing collapse of the pattern P due to the above-described mechanism.

There is also a case that, due to effects from an environmental temperature, etc., it is not easy to control the nozzle moving mechanisms 18, 25 so that expansion of the range 33 by spraying a heated gas can take place completely at the same time with movement of the edge portion 30a of the liquid film 30 in association with expansion of the liquid film-removed region 31.

In contrast thereto, where expansion of the range 33 by spraying a heated gas is performed ahead, it is possible to dry the upper surface of the substrate W while effectively suppressing collapse of the pattern P by the above-described mechanism, with effects from environmental factors, etc., taken into account. Then, the nozzle moving mechanisms 18 and 25 can be controlled relatively easily.

However, where expansion of the range 33 is made later than movement of the edge portion 30*a* of the liquid film 30, there is found a case that the above-described mechanism will not work normally. Thus, a case that expansion of the range 33 is made later than movement of the edge portion 30*a* of the liquid film 30 shall not be included in the present invention.

It is noted that in order to execute the cooling/heating step, in the preferred embodiment, the coolant supply nozzle 21 (coolant supplying unit), the heated gas spraying nozzle 24 (heated gas spraying unit) and the fourth nozzle moving mechanism 25 (movement unit) are joined together. However, a configuration for executing the cooling/heating step shall not be limited thereto.

Figure 8:
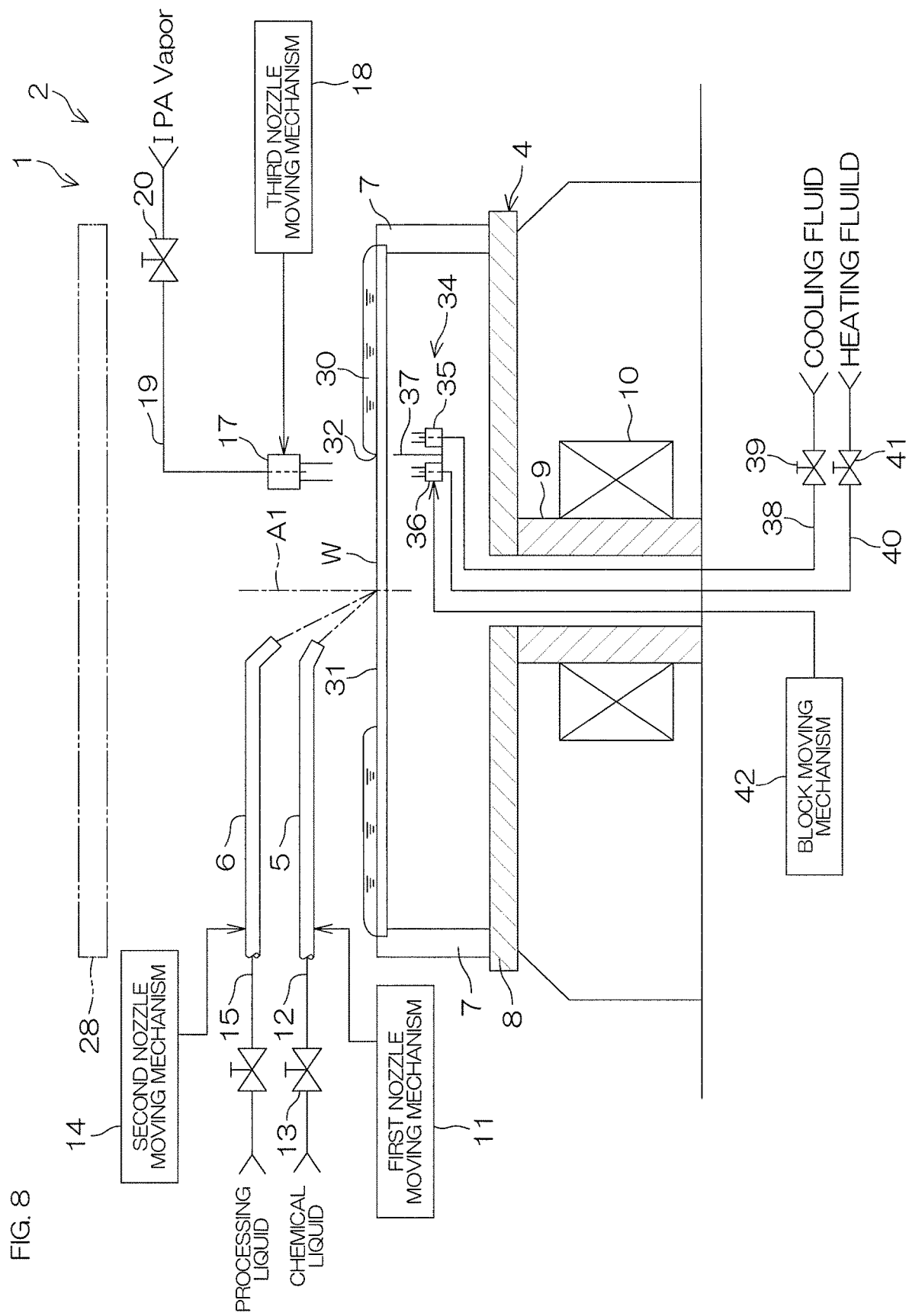
FIG. 8 is a schematic view for describing a brief configuration of a modification example of a processing unit provided at the substrate processing apparatus.

FIG. 8 is a schematic view for describing a brief configuration of a modification example of the processing unit 2 provided at the substrate processing apparatus 1. The processing unit 2 of the modification example is different only in a configuration for executing the cooling/heating step from the processing unit 2 of FIG. 2, as described above. Therefore, in FIG. 8, the same configuration portions as those shown in FIG. 2 are given the same reference numbers as those given in FIG. 2, with a description thereof omitted.

As shown in FIG. 8, the processing unit 2 further includes a cooling/heating block 34 which is movable below the substrate W held by the spin chuck 4.

The cooling/heating block 34 is such that a cooling fluid spraying nozzle 35 for spraying a cooling fluid to a lower surface of a substrate W, a heating fluid spraying nozzle 36 for spraying a heating fluid to the lower surface of the substrate W and a guard 37 for partitioning both the nozzles 35, 36 are made integrally movable. The cooling fluid spraying nozzle 35 is installed outside the substrate W in a radial direction from the guard 37, while the heating fluid spraying nozzle 36 is installed inward of the substrate W in a radial direction from the guard 37.

The cooling fluid spraying nozzle 35 is one example of the cooling unit in which the substrate W held by a chuck pin 7 and a spin base 8 is cooled to a temperature lower than the boiling point of a low surface tension liquid.

A cooling fluid supply pipe 38 is penetrated through a rotation shaft 9 and connected to the cooling fluid spraying nozzle 35. A cooling fluid valve 39 for opening and closing a flow channel thereof is placed on the cooling fluid supply pipe 38. One example of the cooling fluid includes, for example, cold water at a temperature of 1° C. to 10° C. However, the cooling fluid is not limited to cold water, and may include a liquid which is able to cool the substrate W and will not chemically react with the substrate W or a pattern and also a gas inert to the substrate W and a pattern. More specifically, cold water or an inert gas ($N_2$) lower in temperature than a room temperature can be used as the cooling fluid.

The heating fluid spraying nozzle 36 is one example of the heating unit which heats the substrate W held by the chuck pin 7 and the spin base 8 to a temperature not less than the boiling point of the low surface tension liquid.

A heating fluid supply pipe 40 is penetrated through the rotation shaft 9 and connected to the heating fluid spraying nozzle 36. A heating fluid valve 41 for opening and closing a flow channel thereof is placed on the heating fluid supply pipe 40. One example of the heating fluid includes, for example, warm water at a temperature not less than the boiling point of the low surface tension liquid. For example, where the low surface tension liquid is IPA, it is preferable that the heating fluid is at a temperature of 80° C. to 95° C. However, the heating fluid is not limited to warm water and may include a liquid which is able to heat the substrate W and will not chemically react with the substrate W or a pattern and also a gas which is inert to the substrate W and a pattern. More specifically, it may include warm water, nitrogen gas or rare gas such as argon.

The guard 37 is a partition for preventing the heating fluid sprayed to the lower surface of the substrate W by the heating fluid spraying nozzle 36 from leaking outside the substrate W in a radial direction or preventing the cooling fluid sprayed to the lower surface of the substrate W by the cooling fluid spraying nozzle 35 from leaking inside the substrate W in a radial direction.

The guard 37 includes a partition plate. However, the guard 37 is not limited to a partition plate but may be a nozzle which sprays a fluid at an intermediate temperature between a temperature of the cooling fluid and that of the heating fluid to the lower surface of the substrate W. The guard 37 is provided to suppress mixture of the cooling fluid with the heating fluid on the lower surface of the substrate W. And, while a bulk portion of a liquid film 30 on the upper surface of the substrate W is cooled to a temperature lower than the boiling point of the low surface tension liquid, an entire surface of a liquid film-removed region 31 can be heated to a temperature not less than the boiling point of the low surface tension liquid.

The cooling/heating block 34 is moved by a block moving mechanism 42 in a horizontal direction (a direction perpendicular to the rotation axis A1). The cooling/heating block 34 is allowed to move between a central portion which faces a rotation center position on the lower surface of the substrate W and a circumferential edge position which faces a circumferential edge portion of the lower surface of the substrate W by horizontal movement. When the cooling/heating block 34 is positioned at the central portion, the heating fluid is sprayed at the rotation center position on the lower surface of the substrate W and the cooling fluid is sprayed outward of the substrate W in a radial direction. On the other hand, when the cooling/heating block 34 is positioned at the circumferential edge position, the cooling fluid is sprayed at the circumferential edge portion of the lower surface of the substrate W and the heating fluid is sprayed inward of the substrate W in a radial direction.

The block moving mechanism 42 includes, for example, a nozzle arm which is jointed to a rotary shaft along a vertical direction to extend horizontally and an arm driving mechanism which drives the nozzle arm. The cooling/heating block 34 is fixed to the nozzle arm.

The arm driving mechanism is installed below the spin chuck 4. The rotary shaft is inserted through the rotation shaft 9, and the nozzle arm and the cooling/heating block 34 are installed above the spin base 8 and below the substrate W held by the chuck pin 7 and the spin base 8. The arm driving mechanism allows the nozzle arm to move back and forth in a direction that intersects with a rotation direction of the substrate W (for example, a radial direction of the substrate W), thereby moving the nozzle arm horizontally. In response to horizontal movement of the nozzle arm, the cooling/heating block 34 moves in a horizontal direction. The block moving mechanism 42 may be further provided with a mechanism which moves the cooling/heating block 34 in a vertical direction, in addition to a configuration which moves the cooling/heating block 34 horizontally.

According to the modification example, while the substrate W is rotated, supply of a gas which contains vapor of the low surface tension liquid is started from the gas supply nozzle 17 to form the liquid film-removed region 31 at a region which includes a rotation center of the upper surface of the substrate W in a substantially circular shape. Further, spraying of the cooling fluid and that of the heating fluid are started to the lower surface of the substrate W respectively from the cooling fluid spraying nozzle 35 and the heating fluid spraying nozzle 36.

A position at which spraying of the cooling fluid is started from the cooling fluid spraying nozzle 35 is set at a position on the lower surface of the substrate W which corresponds to the outside from an edge portion of the liquid film 30 that surrounds the liquid film-removed region 31. Further, a position at which spraying of the heating fluid is started from the heating fluid spraying nozzle 36 is set at a position on the lower surface of the substrate W which corresponds to the vicinity of the liquid film boundary 32 inside the liquid film-removed region 31.

Then, the block moving mechanism 42 is controlled, while the cooling fluid is continuously sprayed from the cooling fluid spraying nozzle 35 and the heating fluid is continuously sprayed from the heating fluid spraying nozzle 36. Then, the cooling/heating block 34 is moved outside the substrate W in a radial direction at a predetermined speed in synchronization with movement of the liquid film boundary 32 in association with expansion of the liquid film-removed region 31.

In detail, the cooling fluid is sprayed from the cooling fluid spraying nozzle 35, by which the bulk portion of the liquid film 30 on the upper surface of the substrate W is cooled to a temperature lower than the boiling point of the low surface tension liquid. Then, while the cooling fluid is sprayed to continue cooling, a position at which the heating fluid is sprayed to the lower surface of the substrate W from the heating fluid spraying nozzle 36 is moved from the position at which spraying of the heating fluid is started outward in a radial direction in association with movement of the cooling/heating block 34. Thereby, a range which is heated to a temperature not less than the boiling point of the low surface tension liquid and which corresponds to the liquid film-removed region 31 on the upper surface of the substrate W can be expanded in synchronization with expansion of the liquid film-removed region 31 (heating range expanding step).

Figure 9:
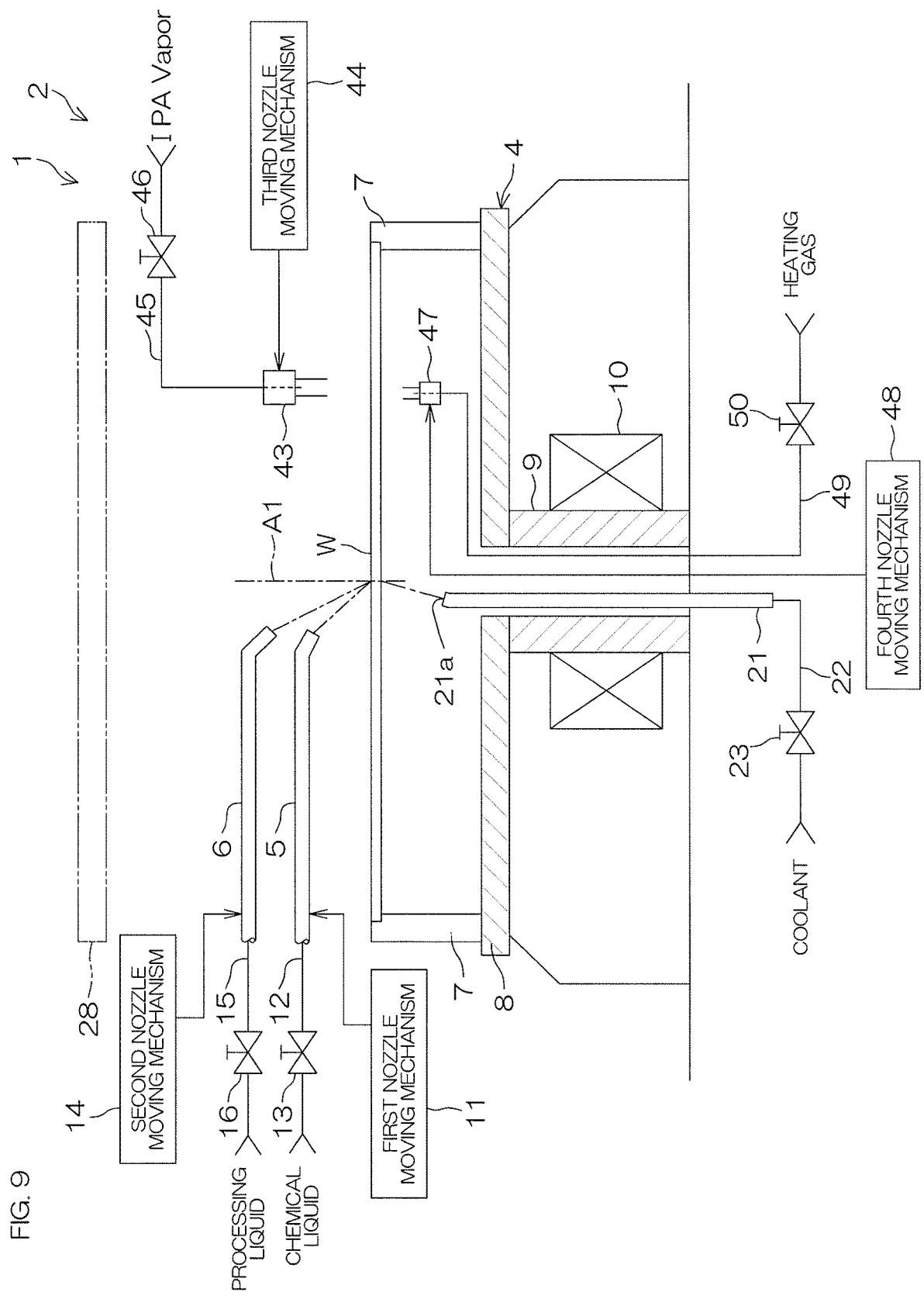
FIG. 9 is a schematic view for describing a brief configuration of a processing unit provided at a substrate processing apparatus according to a second preferred embodiment of the present invention.

FIG. 9 is a schematic view for describing a brief configuration of a processing unit 2 provided at a substrate processing apparatus 1 according to a second preferred embodiment of the present invention. The processing unit 2 of the second preferred embodiment is different in configuration for executing a liquid film-removed region forming step, a liquid film-removed region expanding step and a cooling/heating step from those of the processing unit 2 of FIG. 2. Therefore, in FIG. 9, the same configuration portions as the portions described in FIG. 2 are given the same reference numbers as those described in FIG. 2, with a description thereof omitted.

As shown in FIG. 9, the processing unit 2 further includes a gas spraying nozzle 43 which is movable above a substrate W held by a spin chuck 4. The gas spraying nozzle 43 is provided with a plurality of nozzle holes arranged in a line shape or a slit-shaped nozzle hole. The gas spraying nozzle 43 is one example of the gas supplying unit which sprays a gas that contains vapor of a low surface tension liquid lower in surface tension than water from the nozzle hole to an upper surface of the substrate W held by a chuck pin 7 and a spin base 8. The gas spraying nozzle 43 sprays a gas that contains vapor of the low surface tension liquid lower in surface tension than water to the upper surface of the substrate W as a thin layer form (air knife form) over the entire width of the upper surface of the substrate W, for example, in the case of a circular substrate W, over the entire width of a diameter of the substrate W.

The gas spraying nozzle 43 is moved by a third nozzle moving mechanism 44 in a horizontal direction (a direction perpendicular to the rotation axis A1) and in a vertical direction (direction parallel to the rotation axis A1). The gas spraying nozzle 43 is allowed to move between one end portion and the other end portion of the upper surface of the substrate W by horizontal movement. Where the substrate W is, for example, a circular substrate, the nozzle is allowed to move from one end portion set on a circumferential edge of the upper surface of the substrate W to the other end portion set on a circumferential edge thereof on the opposite side, with a rotation center held between them.

The third nozzle moving mechanism 44 is one example of the upper surface movement unit which moves a position at which the gas is sprayed from the gas spraying nozzle 43. The third nozzle moving mechanism 44 includes, for example, a rotary shaft along a vertical direction, a nozzle arm jointed to the rotary shaft to extend horizontally and an arm driving mechanism which drives the nozzle arm. The arm driving mechanism moves the rotary shaft rotationally around a vertical rotary axis, moving the nozzle arm horizontally and also elevating and lowering the rotary shaft in a vertical direction, thereby allowing the nozzle arm to move up and down. The gas spraying nozzle 43 is fixed to the nozzle arm. In response to horizontal movement and elevation and lowering of the nozzle arm, the gas spraying nozzle 43 moves in a horizontal direction and in a vertical direction.

The nozzle arm further includes a link mechanism. The link mechanism moves the gas spraying nozzle 43 in a horizontal direction, while maintaining an arrangement of line-shaped nozzle holes or a slit-shaped nozzle hole of the gas spraying nozzle 43 so as to be parallel to the upper surface of the substrate W and also in a direction which intersects with a movement direction of the gas spraying nozzle 43 at a certain angle, for example, at 90 degrees.

Due to functions of the link mechanism, a thin layer (air knife) of the gas sprayed from the gas spraying nozzle 43 to the upper surface of the substrate W is moved from one end portion of the upper surface of the substrate W to the other end portion while maintaining an intersecting state in the movement direction of the gas spraying nozzle 43 at a certain angle, for example, 90 degrees.

A gas supply pipe 45 is connected to the gas spraying nozzle 43. A gas valve 46 for opening and closing a flow channel thereof is placed on the gas supply pipe 45.

The processing unit 2 further includes a heated gas spraying nozzle 47 which is movable below the substrate W held by the spin chuck 4. The heated gas spraying nozzle 47 is provided with a plurality of nozzle holes arranged in a line shape or a slit-shaped nozzle hole, and one example of the heated gas spraying unit which sprays a heated gas from the nozzle holes to the lower surface of the substrate W held by the chuck pin 7 and the spin base 8. The heated gas spraying nozzle 47 sprays the heated gas over the entire width of the lower surface of the substrate W, for example, where the substrate W is a circular substrate, to the lower surface of the substrate W in a thin layer form (air knife form) over a diameter of the substrate W.

The heated gas spraying nozzle 47 is moved by a fourth nozzle moving mechanism 48 in a horizontal direction (a direction perpendicular to the rotation axis A1). The heated gas spraying nozzle 47 is allowed to move between one end portion of the lower surface of the substrate W to the other end portion by horizontal movement. For example, where the substrate W is a circular substrate, the nozzle is allowed to move from one end portion set on a circumferential edge of the lower surface of the substrate W corresponding to one end portion of the upper surface of the previously described substrate W to the other end portion set on a circumferential edge on the opposite side, with a rotation center held between them.

The fourth nozzle moving mechanism 48 is one example of the lower surface movement unit which moves a position at which the heated gas is sprayed from the heated gas spraying nozzle 47. The fourth nozzle moving mechanism 48 includes, for example, a nozzle arm which is jointed to a rotary shaft along a vertical direction to extend horizontally and an arm driving mechanism which drives the nozzle arm. The heated gas spraying nozzle 47 is fixed to the nozzle arm.

The arm driving mechanism allows the nozzle arm to move back and forth in a direction which intersects with a rotation direction of the substrate W (for example, a radial direction of the substrate W), thereby moving the nozzle arm horizontally. In response to horizontal movement of the nozzle arm, the heated gas spraying nozzle 47 moves in a horizontal direction.

The nozzle arm further includes a link mechanism. The link mechanism maintains an arrangement of the line-shaped nozzle holes or the slit-shaped nozzle hole of the heated gas spraying nozzle 47 in a state that the arrangement is parallel to the lower surface of the substrate W and also parallel to the arrangement of the line-shaped nozzle holes or the slit-shaped nozzle hole of the gas spraying nozzle 43. Then, with this state maintained, the heated gas spraying nozzle 47 is moved in a horizontal direction.

Due to functions of the link mechanism, a thin layer (air knife) of the heated gas sprayed from the heated gas spraying nozzle 47 to the lower surface of the substrate W is allowed to move from one end portion of the lower surface of the substrate W to the other end portion, while being maintained parallel to the thin layer (air knife) of the gas sprayed from the gas spraying nozzle 43 to the upper surface of the substrate W.

In the preferred embodiment, the arm driving mechanism is installed below the spin chuck 4. The rotary shaft is inserted through the rotation shaft 9. The nozzle arm, the link mechanism and the heated gas spraying nozzle 47 are installed above the spin base 8 and also below the substrate W held by the chuck pin 7 and spin base 8. Further, the fourth nozzle moving mechanism 48 may be provided with a mechanism which moves the heated gas spraying nozzle 47 in a vertical direction, in addition to a configuration which moves the heated gas spraying nozzle 47 horizontally.

A heated gas supply pipe 49 is inserted through the rotation shaft 9 and connected to the heated gas spraying nozzle 47. A heated gas valve 50 for opening and closing a flow channel thereof is placed on the heated gas supply pipe 49.

Figure 10:
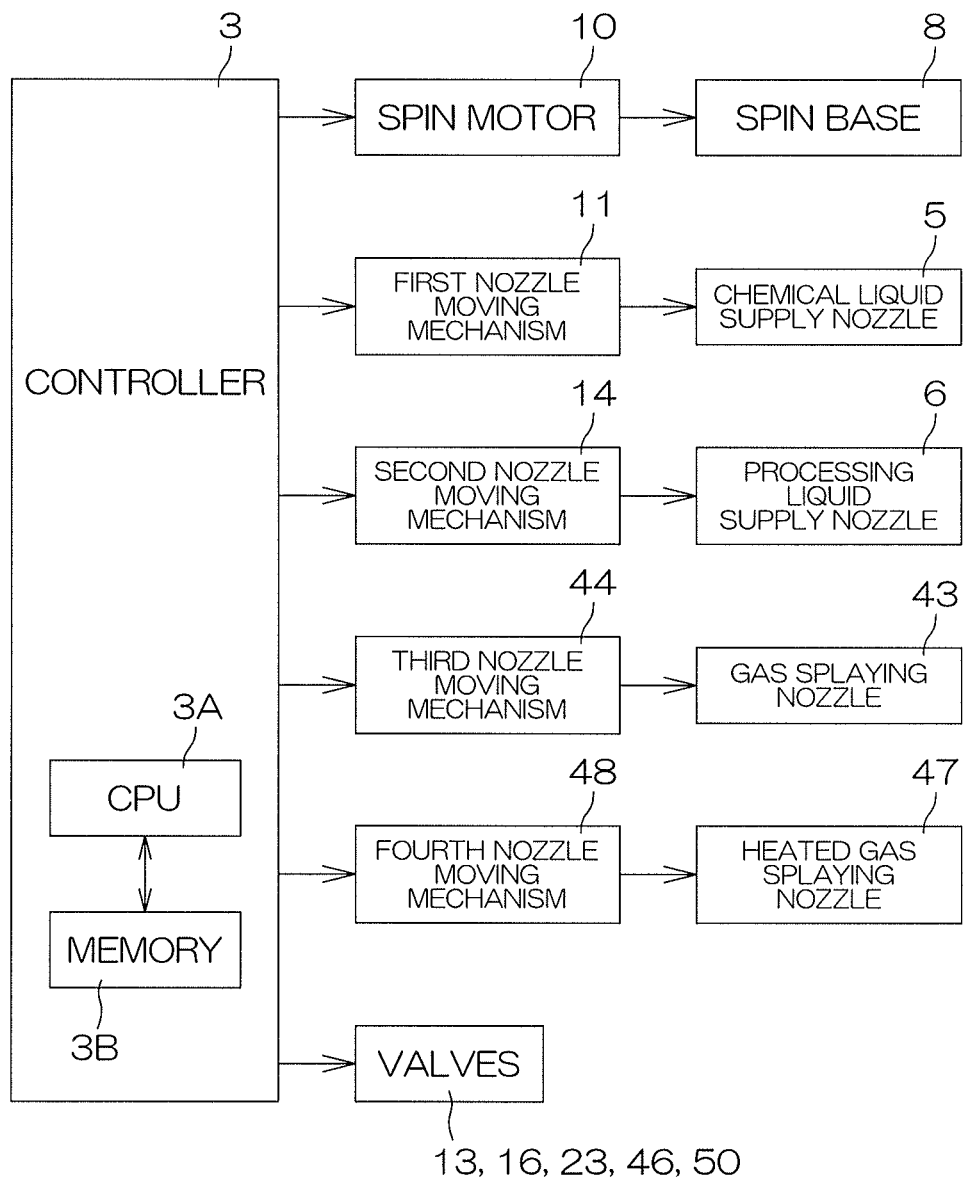
FIG. 10 is a block diagram for describing an electrical configuration of a major portion of the substrate processing apparatus.

FIG. 10 is a block diagram for describing an electrical configuration of a major portion of the substrate processing apparatus 1.

The substrate processing apparatus 1 includes a controller 3. The controller 3 is provided with a microcomputer to control a control target provided at the substrate processing apparatus 1 according to a predetermined control program. More specifically, the controller 3 includes a processor (CPU) 3A and a memory 3B in which the control program is stored and configured so as to perform various types of control for substrate processing by execution of the control program by the processor 3A. The controller 3 is programmed to control, the spin motor 10, the first nozzle moving mechanism 11, the second nozzle moving mechanism 14, the third nozzle moving mechanism 44, the fourth nozzle moving mechanism 48, and valves 13, 16, 23, 46, 50.

Then, a detailed description will be given of a drying processing step by the processing unit 2.

Figure 11:
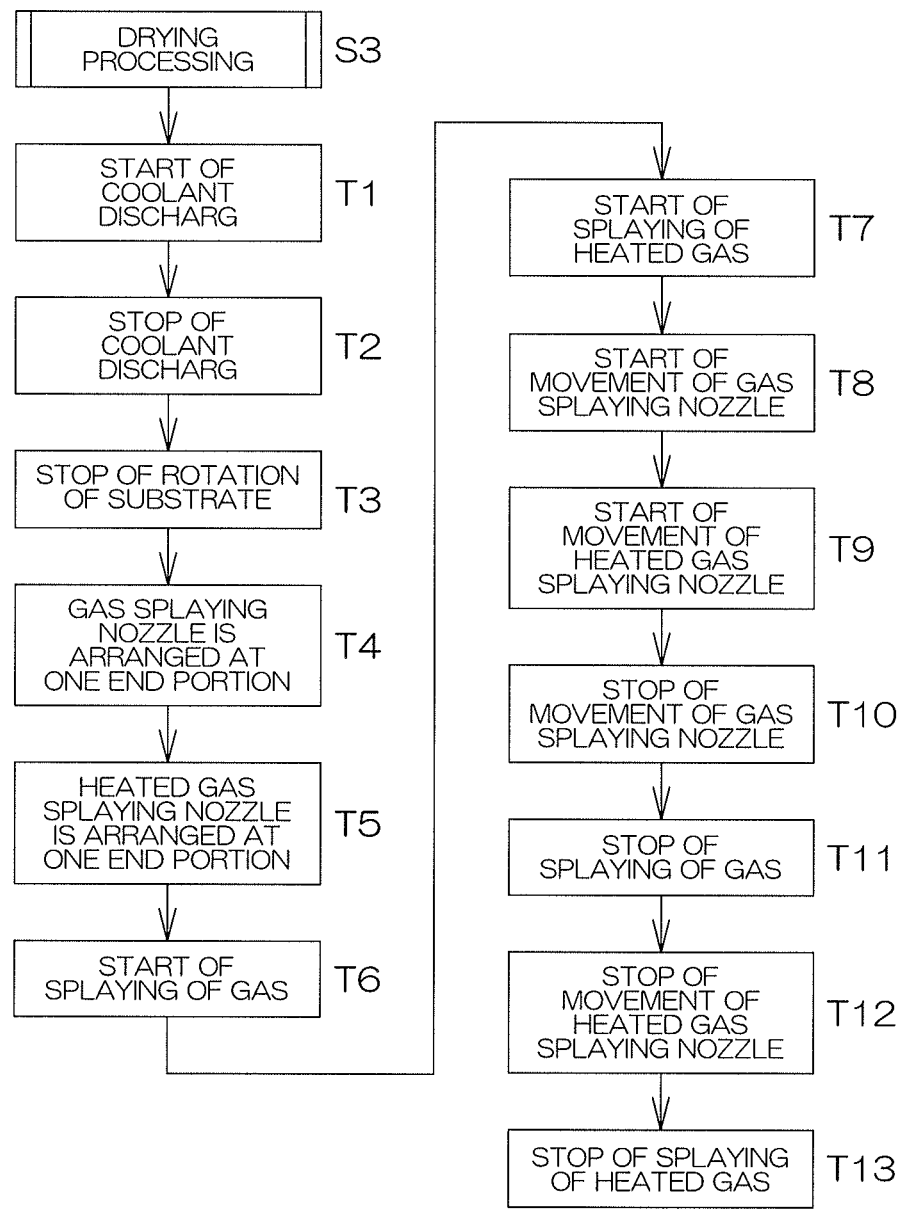
FIG. 11 is a flowchart for describing the drying processing step by the processing unit.

FIG. 11 is a flowchart for describing an example of the drying processing step by the processing unit 2. FIG. 12A to FIG. 12D are each an illustrative sectional view for describing a mode of an example of the drying processing step.

In the drying processing step, the controller 3 first closes the processing liquid valve 16 to stop supply of a processing liquid from the processing liquid supply nozzle 6. Then, the controller 3 moves the processing liquid supply nozzle 6 to a retracted position.

Figure 12A:
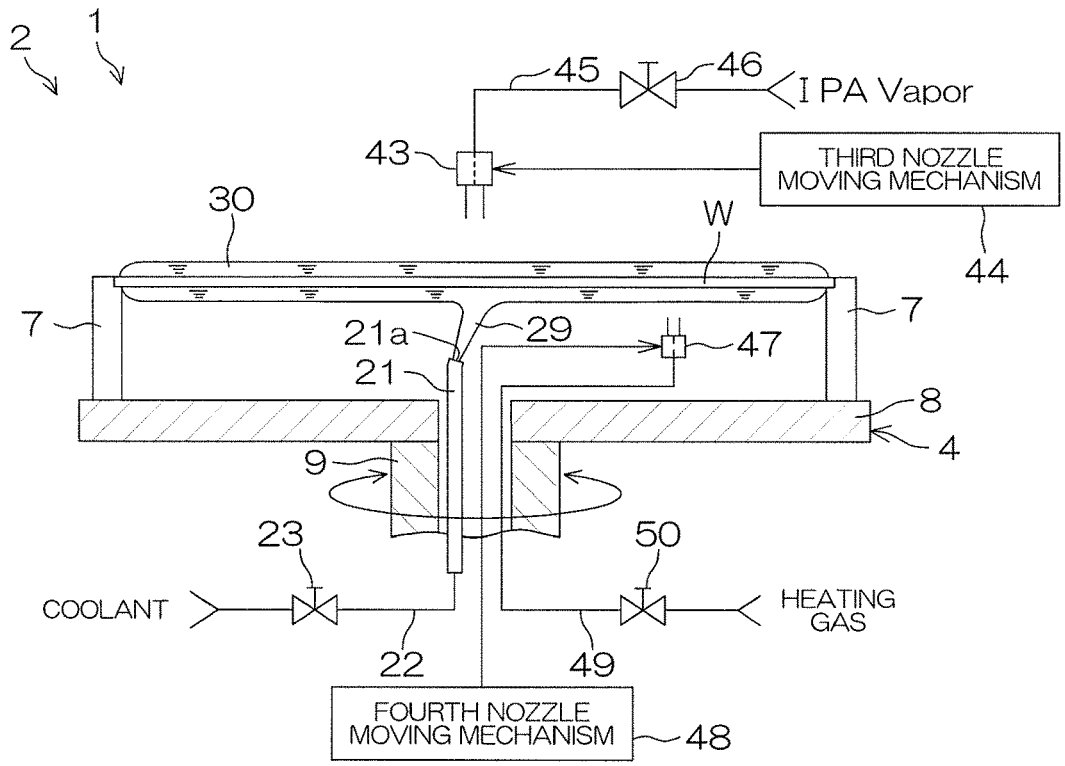
FIG. 12A is an illustrative sectional view for describing a mode of the drying processing step.

Then, the controller 3 controls the spin motor 10 to rotate the spin base 8 at a predetermined coolant supplying speed. The coolant supplying speed is, for example, 10 rpm to 20 rpm. Then, the controller 3 opens the coolant valve 23, thereby allowing the coolant supply nozzle 21 to start supply of a coolant (for example, cold water) 29 (Step T1). As shown in FIG. 12A, the coolant 29 is discharged from a discharge port 21a to a rotation center position on the lower surface of the substrate W in a rotation state. The discharged coolant 29 is fed to the lower surface of the substrate W substantially in its entirety by action of centrifugal force. Then, the coolant 29 is continuously supplied to the lower surface of the substrate W, by which the substrate W and the liquid film 30 on the upper surface of the substrate W are cooled to a temperature lower than the boiling point of the low surface tension liquid (cooling step).

After a certain period of the cooling step, the controller 3 closes the coolant valve 23 to stop supply of the coolant 29 from the coolant supply nozzle 21 (Step T2).

Then, the controller 3 controls the spin motor 10 to stop rotation of the spin base 8 (Step T3).

Figure 12B:
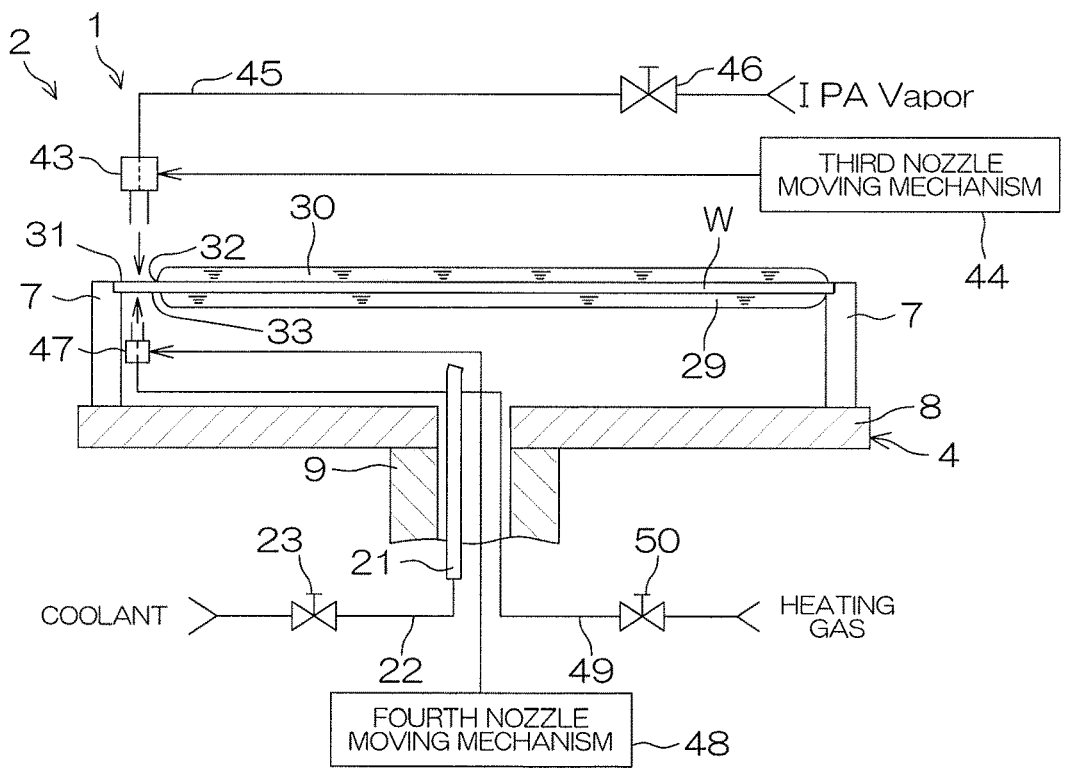
FIG. 12B is an illustrative sectional view for describing a mode of the drying processing step.
Figure 12C:
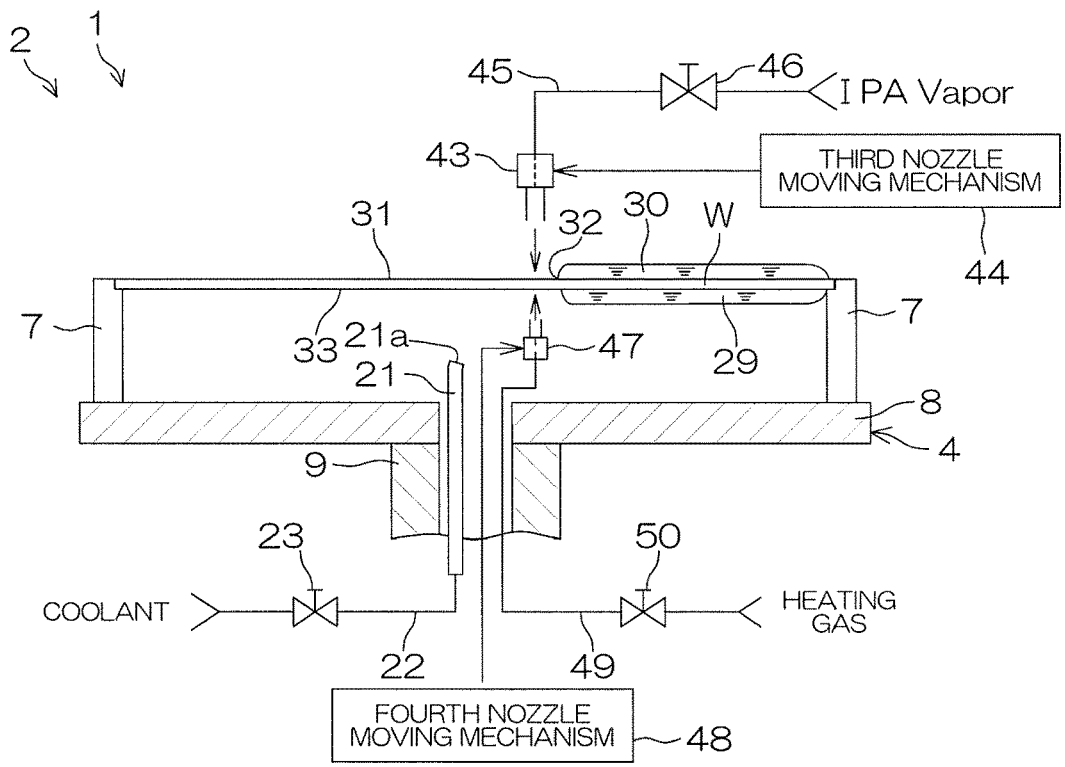
FIG. 12C is an illustrative sectional view for describing a mode of the drying processing step.
Figure 12D:
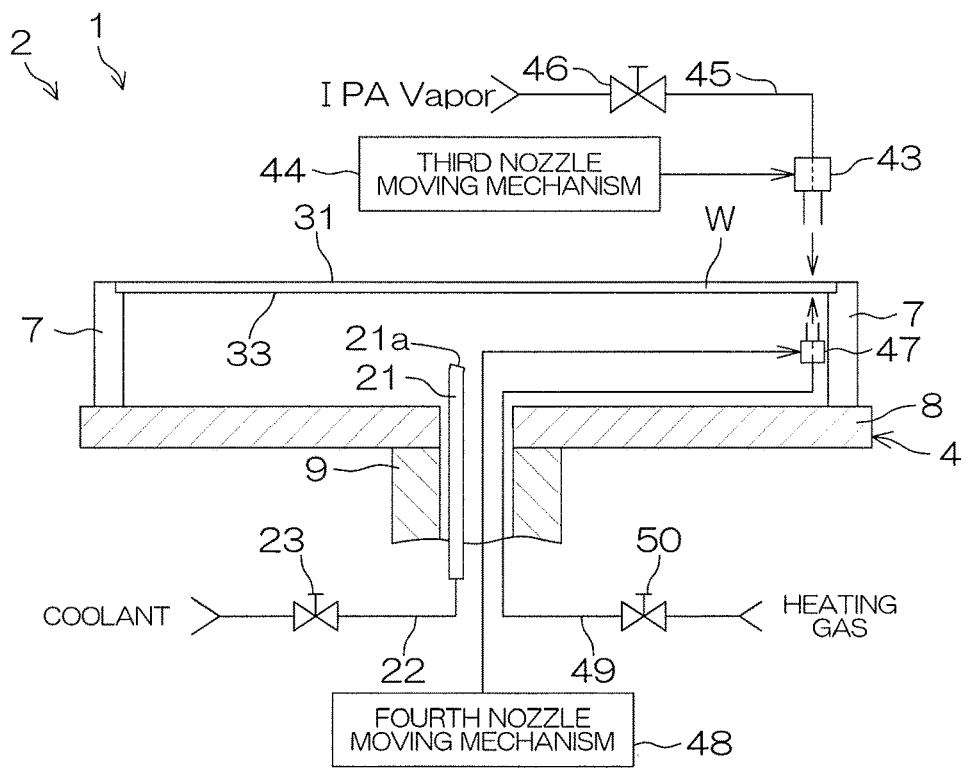
FIG. 12D is an illustrative sectional view for describing a mode of the drying processing step.

Then, as shown in FIG. 12B to FIG. 12D, a gas which contains vapor of the low surface tension liquid is sprayed in a thin layer form to one end portion of the upper surface of the substrate W. Thereby, there are executed a liquid film-removed region forming step in which a liquid film-removed region 31 is formed at a region including one end portion of the upper surface of the substrate W and a liquid film-removed region expanding step in which the formed liquid film-removed region 31 is expanded in a direction of other end portion of the substrate W.

Further, in parallel with the liquid film removed region forming step and the liquid film-removed region expanding step, a heated gas is sprayed at one end portion of the lower surface of the substrate W in a thin layer form parallel to the gas in the thin layer form sprayed to the upper surface of the substrate W. Thereby, there are executed a heating step in which the liquid film-removed region 31 on the upper surface of the substrate W is heated to a temperature not less than the boiling point of the low surface tension liquid and a spray position moving step in which a position at which the heated gas is sprayed is moved in synchronization with movement of the liquid film boundary 32 by expansion of the liquid film-removed region 31.

In detail, the controller 3 controls the third nozzle moving mechanism 44, by which the gas spraying nozzle 43 is disposed at a gas supply start position above the substrate W (Step T4). The gas supply start position is, for example, a position at which a gas that contains vapor of the low surface tension liquid discharged from the gas spraying nozzle 43 reaches one end portion of the upper surface of the substrate W.

The controller 3 also controls the fourth nozzle moving mechanism 48 to dispose the heated gas spraying nozzle 47 at a heated-gas spraying start position below the substrate W (Step T5). The heated-gas spraying start position is, for example, a position at which a heated gas discharged from the heated gas spraying nozzle 47 reaches one end portion of the lower surface of the substrate W which corresponds to one end portion of the upper surface of the substrate W.

Then, the controller 3 opens the gas valve 46, thereby starting to spray a gas that contains vapor of the low surface tension liquid in a thin layer form from the gas spraying nozzle 43 to one end portion of the upper surface of the substrate W (Step T6). The gas in a thin layer form is sprayed from the gas spraying nozzle 43 to the liquid film 30, by which a processing liquid which forms the liquid film 30 is pushed by the sprayed gas from one end portion of the upper surface of the substrate W to the other end portion. Therefore, as shown in FIG. 12B, the liquid film-removed region 31 is formed at a region which contains one end portion of the upper surface of the substrate W (liquid film-removed region forming step).

Further, the controller 3 opens the heated gas valve 50, thereby starting to spray a heated gas in a thin layer form which is heated to a temperature not less than the boiling point of the low surface tension liquid from the heated gas spraying nozzle 47 to one end portion of the lower surface of the substrate W (Step T7). As described previously, the heated gas is sprayed in a thin layer form parallel to the gas in the thin layer form which is sprayed to the upper surface of the substrate W. The heated gas in the thin layer form is sprayed from the heated gas spraying nozzle 47, by which the coolant 29 in a range including one end portion of the lower surface of the substrate W is selectively removed and also the range 33 from which the coolant 29 is removed is heated by the heated gas. As described previously, the coolant 29 is left at a portion corresponding to a bulk portion excluding the edge portion of the liquid film 30. Therefore, the range 33 is regarded as a range which includes the liquid film-removed region 31 on the upper surface of the substrate W and the edge portion of the liquid film 30, and an entire surface of the liquid film-removed region 31 on the upper surface of the substrate W included in the range 33 is selectively heated to a temperature not less than the boiling point of the low surface tension liquid (heating step).

Next, the controller 3 controls the third nozzle moving mechanism 44, while continuously spraying a gas that contains vapor of the low surface tension liquid from the gas spraying nozzle 43, moving the gas spraying nozzle 43 from the gas supply start position (one end portion) toward the other end portion of the substrate W at a predetermined speed (Step T8). The gas spraying nozzle 43 is moved, by which a position at which the gas in a thin layer form is sprayed to the upper surface of the substrate W from the gas spraying nozzle 43 moves from one end portion to the other end portion. Then, in association with this movement, a processing liquid which forms the liquid film boundary 32 of the liquid film 30 adjacent to the liquid film-removed region 31 is further pushed toward the other end portion. Therefore, the liquid film-removed region 31 is expanded from one end portion to the other end portion (liquid film-removed region expanding step).

Further, the controller 3 controls the fourth nozzle moving mechanism 48 to move the heated gas spraying nozzle 47, while continuously spraying a heated gas from the heated gas spraying nozzle 47. That is, the heated gas spraying nozzle 47 is moved in a direction from the heated-gas spraying start position (one end portion) to the other end portion of the substrate W at a predetermined speed in synchronization with movement of the liquid film boundary 32 by expansion of the liquid film-removed region 31 (Step T9). The heated gas spraying nozzle 47 is moved to the other end portion in synchronization with movement of the liquid film boundary 32, by which a position at which the heated gas in a thin layer form is sprayed from the heated gas spraying nozzle 47 to the lower surface of the substrate W moves in a direction from one end portion to the other end portion. Then, in association with the movement, the coolant 29 on the lower surface of the substrate W is removed, by which the range 33 heated by the heated gas can be expanded in synchronization with expansion of the liquid film-removed region 31 (heating range expanding step).

At a time point when the gas spraying nozzle 43 has reached the gas supply completion position (other end portion), the controller 3 controls the third nozzle moving mechanism 44 to stop movement of the gas spraying nozzle 43 (Step T10). Then, the gas valve 46 is closed to stop spray of a gas that contains vapor of the low surface tension liquid from the gas spraying nozzle 43 (Step T11). The gas spraying nozzle 43 has reached the other end portion, by which the liquid film boundary 32 moves up to the other end portion of the upper surface of the substrate W, thus resulting in a state that the liquid film-removed region 31 is expanded to extend to the entire area of the upper surface of the substrate W as shown in FIG. 12D.

Further, at a time point when the heated gas spraying nozzle 47 has reached the heated gas spraying completion position (other end portion), the fourth nozzle moving mechanism 48 is controlled to stop movement of the heated gas spraying nozzle 47 (Step T12). Then, the heated gas valve 50 is closed to stop spray of the heated gas from the heated gas spraying nozzle 47 (Step T13). The heated gas spraying nozzle 47 reaches the other end portion, by which the coolant 29 is removed entirely from the lower surface side of the substrate W to complete the drying processing step and also complete the substrate processing by the processing unit 2.

A description has so far been given of preferred embodiments of the present invention. The present invention can be executed in other modes.

For example, in order to heat the liquid film-removed region 31 from the lower surface side of the substrate W, the liquid film-removed region 31 may be heated from the lower surface side of the substrate W, for example, by using radiant heat of a heat source such as a lamp, in place of spraying of a heated gas or the like.

Further, in the first preferred embodiment, the gas supply nozzle 17 was moved outward in a radial direction, by which a position at which the gas that contains vapor of the low surface tension liquid was sprayed to the upper surface of the substrate W was moved, thereby moving the liquid film boundary 32 of the liquid film 30 in the same direction. However, for example, the gas may be sprayed sequentially from line-shaped nozzles or a slit-shaped nozzle outward in a radial direction, thereby moving the liquid film boundary 32 of the liquid film 30 outward in a radial direction.

Similarly, in the first preferred embodiment, the heated gas spraying nozzle 24 was moved outward in a radial direction, by which a position at which the heated gas was sprayed to the lower surface of the substrate W was moved to expand the heating range. However, for example, the heated gas may be sprayed sequentially outward in a radial direction from a plurality of nozzle holes arranged in a line shape to expand a heating range outward in a radial direction.

Specifically, many discharge ports are brought close to the lower surface of the substrate W and also disposed so as to be along a radial direction of the substrate W. The heated gas is discharged from discharge ports facing a lower surface central portion of the substrate W, thereby heating the lower surface central portion of the substrate W. Then, the discharge ports which discharge the heated gas are sequentially increased in number in a radial direction, thus making it possible to expand a heating range outward in a radial direction.

Further, in the modification example, for example, the cooling fluid and the heating fluid are sprayed sequentially from a plurality of nozzle holes arranged in a line shape outward in a radial direction, and the heating range may be expanded outward in a radial direction, while cooling a bulk portion of the liquid film 30 by the cooling fluid.

Still further, the lower surface of the substrate W is made into a liquid-tight structure, and the cooling fluid is first filled to cool the substrate W substantially in its entirety to a temperature lower than the boiling point of the low surface tension liquid. Then, for example, while the cooling fluid is expelled from a circumferential edge of the lower surface of the substrate W, the heating fluid may be fed into the lower surface of the substrate W from a rotation center of the substrate W to expand a heating range outward in a radial direction.

Further, in both of the preferred embodiment and the modification example described so far, a description has been given of a case where the substrate processing apparatus 1 is an apparatus which processes a circular plate-shaped substrate. However, the substrate processing apparatus 1 may be an apparatus which processes a polygonal substrate.

The present application corresponds to Japanese Patent Application No. 2017-003275 filed in the Japan Patent Office on Jan. 12, 2017, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A substrate processing method comprising:
   a substrate holding step which holds a substrate horizontally;
   a liquid film forming step which supplies a processing liquid to an upper surface of the substrate to form a liquid film of the processing liquid which covers the upper surface of the substrate;
   a liquid film-removed region forming step which forms, on the upper surface of the substrate, a liquid film-removed region in which the processing liquid is removed from a portion of the liquid film;
   a liquid film-removed region expanding step which expands the formed liquid film-removed region;
   a vapor supplying step which supplies a gas comprising vapor of a low surface tension liquid lower in surface tension than the processing liquid to an edge portion of the remaining liquid film adjacent to the liquid film-removed region from the upper surface side of the substrate in parallel with the liquid film-removed region expanding step;
   a cooling/heating step comprising a cooling step in which a coolant is supplied to the lower surface of the substrate substantially in its entirety, and a heating step in which a heated fluid is sprayed to a position on the lower surface of the substrate corresponding to the liquid film-removed region to heat the liquid film-removed region to a temperature not less than the boiling point of the low surface tension liquid; and which heats the liquid film-removed region to a temperature not less than the boiling point of the low surface tension liquid, while cooling a portion excluding the edge portion of the liquid film on the substrate to a temperature lower than the boiling point of the low surface tension liquid from the lower surface side of the substrate, in parallel with the liquid film-removed region expanding step; and
   a heating range expanding step which expands a range across which the liquid film-removed region is heated from the lower surface side of the substrate, in synchronization with expansion of the liquid film-removed region.

2. The substrate processing method according to claim 1 further comprising:
   a substrate rotating step in which the substrate is rotated around a predetermined vertical rotation axis, in parallel with the liquid film-removed region forming step, the liquid film-removed region expanding step, the vapor supplying step, the cooling/heating step and the heated range expanding step; wherein
   from the liquid film-removed region forming step to the liquid film-removed region expanding step, the substrate rotating step is executed to rotate the substrate, while spraying the gas to the vicinity of the rotation center on the upper surface of the substrate, thus forming the liquid film-removed region in a substantially circular shape at a region of the upper surface of the substrate including the rotation center, and a position at which the gas is sprayed is moved from the rotation center outward in a radial direction, thereby expanding the liquid film-removed region,
   from the cooling/heating step to the heated range expanding step, the substrate rotating step is executed to rotate the substrate, while heating a range of the lower surface of the substrate including the rotation center corresponding to the liquid film-removed region to a temperature not less than the boiling point of the low surface tension liquid, and the heating range is expanded from the rotation center outward in a radial direction in synchronization with expansion of the liquid film-removed region by movement of the position at which the gas is sprayed.

3. The substrate processing method according to claim 1, wherein
   the heating range expanding step comprising a spray position moving step in which a position on the lower surface of the substrate at which a heated gas as the heated fluid is sprayed is moved in synchronization with movement of a boundary between the liquid film and the liquid film-removed region by expansion of the liquid film-removed region.

4. The substrate processing method according to claim 1, wherein,
   from the liquid film-removed region forming step to the liquid film-removed region expanding step, the gas in a thin layer form over the entire width of the upper surface of the substrate is sprayed to one end portion of the upper surface of the substrate, by which the liquid film-removed region is formed in the vicinity of the one end portion of the upper surface of the substrate and also the position at which the gas is sprayed is moved from the one end portion to the other end portion of the substrate, thereby expanding the liquid film-removed region, the cooling/heating step comprising:

a cooling step in which a coolant is supplied to the lower surface of the substrate substantially in its entirety to cool the liquid film to a temperature lower than the boiling point of the low surface tension liquid, and a heating step in which a heated gas is sprayed in a thin layer form which is parallel to the gas in the thin layer form and over the entire width of the lower surface of the substrate to a position on the lower surface of the substrate corresponding to the liquid film-removed region to heat the liquid film-removed region to a temperature not less than the boiling point of the low surface tension liquid, and the heating range expanding step comprising a spray position moving step in which the position on the lower surface of the substrate at which the heated gas is sprayed is moved in synchronization with movement of a boundary between the liquid film and the liquid film-removed region by expansion of the liquid film-removed region.

5. The substrate processing method according to claim 1, wherein the processing liquid comprising water and the low surface tension liquid comprising an organic solvent lower in surface tension than water.

\* \* \* \* \*